(12) United States Patent
Fung

(10) Patent No.: US 12,356,682 B2
(45) Date of Patent: Jul. 8, 2025

(54) SEMICONDUCTOR STRUCTURE WITH CONDUCTIVE STRUCTURE

(71) Applicant: Taiwan Semiconductor Manufacturing Company, Ltd., Hsinchu (TW)

(72) Inventor: Ka-Hing Fung, Zhudong Township, Hsinchu County (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 456 days.

(21) Appl. No.: 17/749,359

(22) Filed: May 20, 2022

(65) Prior Publication Data

US 2023/0378260 A1    Nov. 23, 2023

(51) Int. Cl.
| | |
|---|---|
| *H10D 62/10* | (2025.01) |
| *H10D 30/01* | (2025.01) |
| *H10D 30/67* | (2025.01) |
| *H10D 64/01* | (2025.01) |
| *H10D 84/01* | (2025.01) |
| *H10D 84/03* | (2025.01) |

(52) U.S. Cl.
CPC ......... *H10D 62/118* (2025.01); *H10D 30/031* (2025.01); *H10D 30/6713* (2025.01); *H10D 30/6735* (2025.01); *H10D 30/6757* (2025.01); *H10D 64/017* (2025.01); *H10D 84/0128* (2025.01); *H10D 84/013* (2025.01); *H10D 84/038* (2025.01)

(58) Field of Classification Search
CPC ......... H01L 29/0665; H01L 21/823412; H01L 21/823418; H01L 29/42392; H01L 29/78618; H01L 29/78696; H10D 62/118; H10D 30/6713
USPC .......................................................... 257/288
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |

(Continued)

*Primary Examiner* — Quoc D Hoang
(74) *Attorney, Agent, or Firm* — Birch, Stewart, Kolasch & Birch, LLP

(57) ABSTRACT

Semiconductor structures and methods for manufacturing the same are provided. A semiconductor device structure is provided. The semiconductor structure includes a plurality of first nanostructures formed over a substrate, and a gate structure formed over the first nanostructures. The semiconductor structure includes a source/drain (S/D) structure formed adjacent to the gate structure, and a silicide layer formed on a sidewall surface of the S/D structure. The semiconductor structure also includes an S/D contact structure formed over the silicide layer, and the S/D contact structure extends from a first position to a second position The first position is higher than the top surface of the gate structure, and the second position is below the bottommost nanostructure.

20 Claims, 30 Drawing Sheets

(56) References Cited

U.S. PATENT DOCUMENTS

| | | | |
|---|---|---|---|
| 9,608,116 B2 | 3/2017 | Ching et al. | |
| 2022/0344481 A1* | 10/2022 | Hong | H01L 27/088 |

* cited by examiner

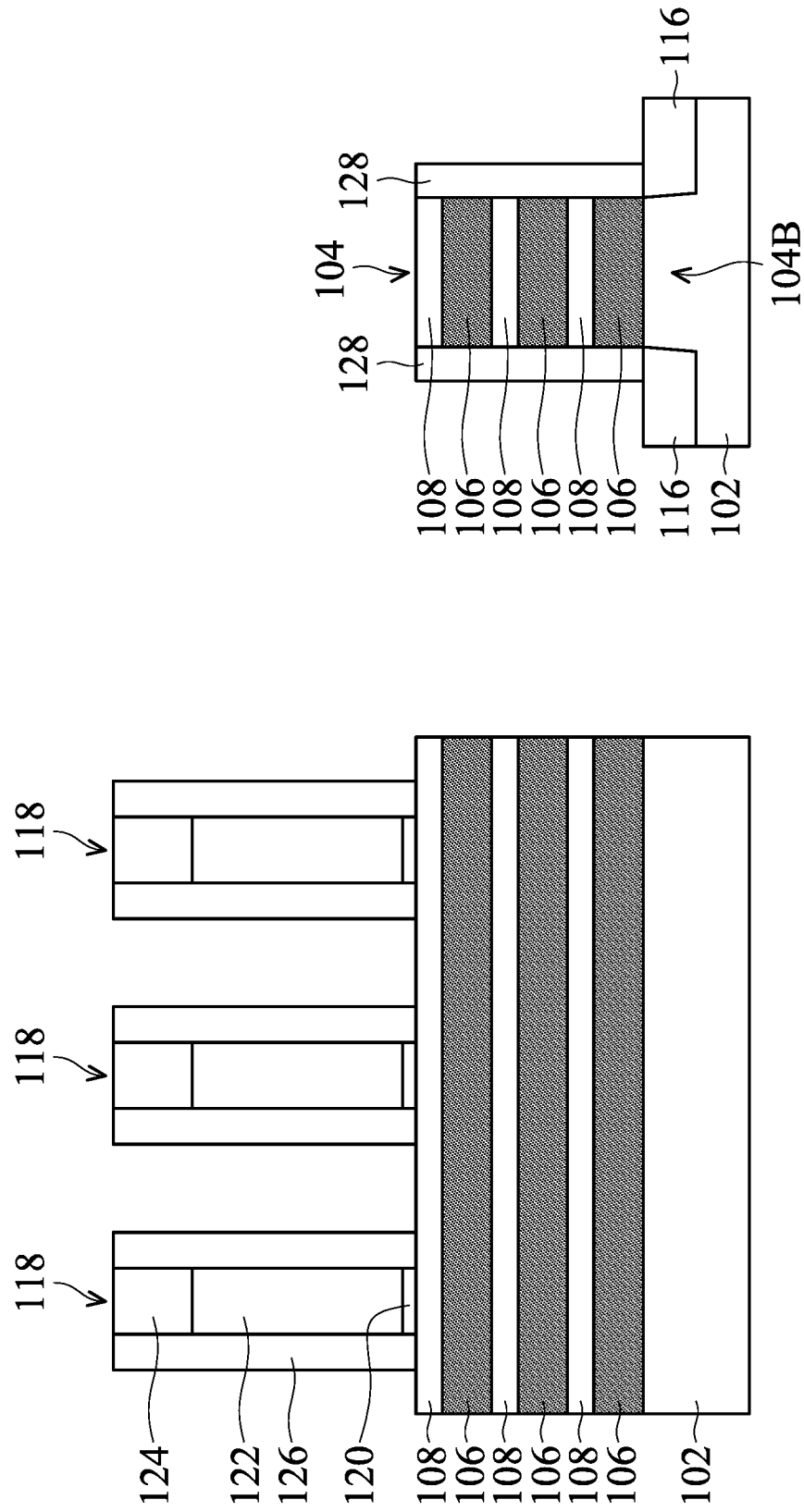

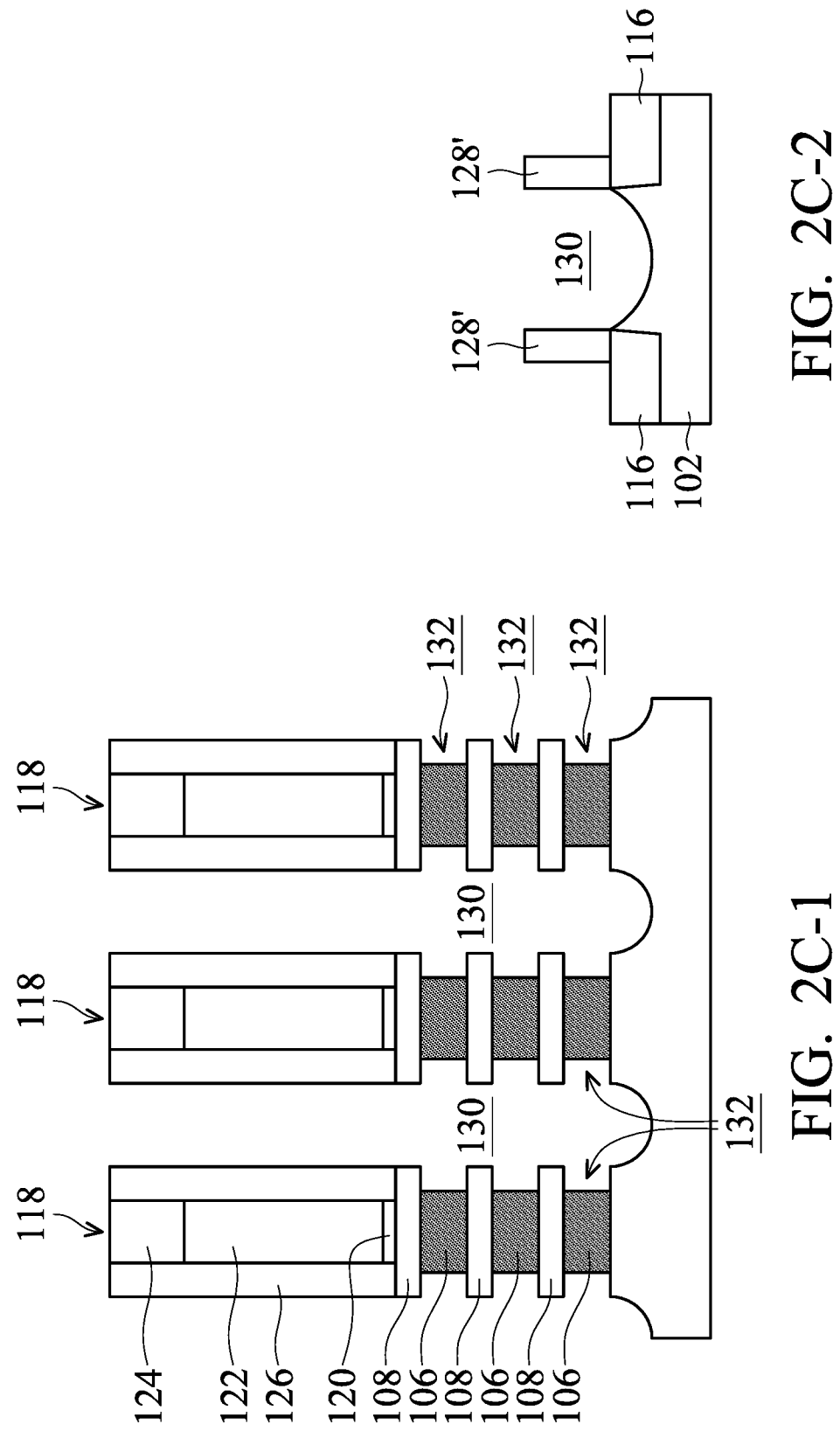

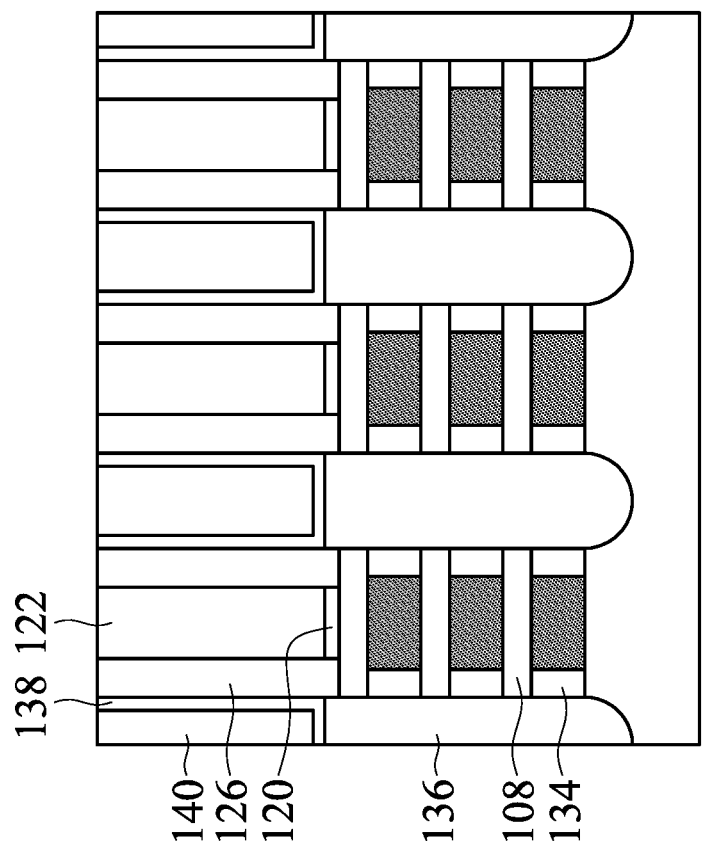
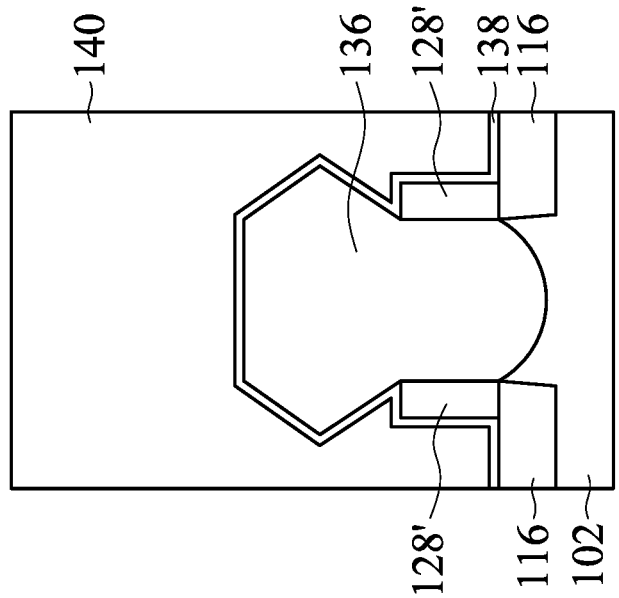
FIG. 2F-1
FIG. 2F-2

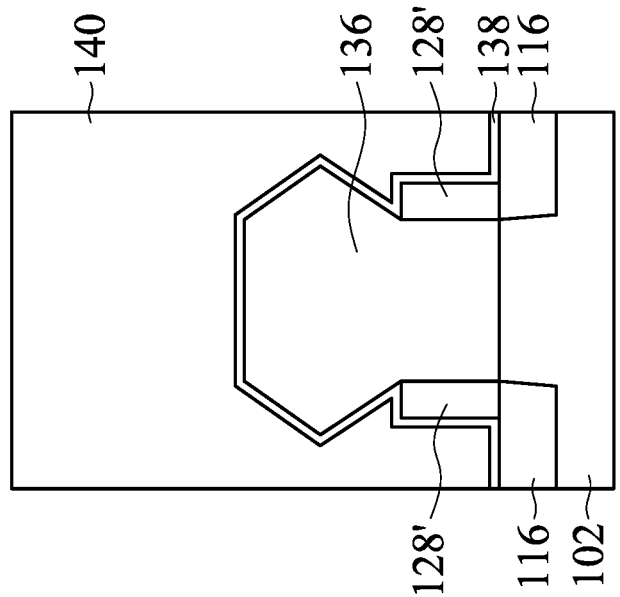
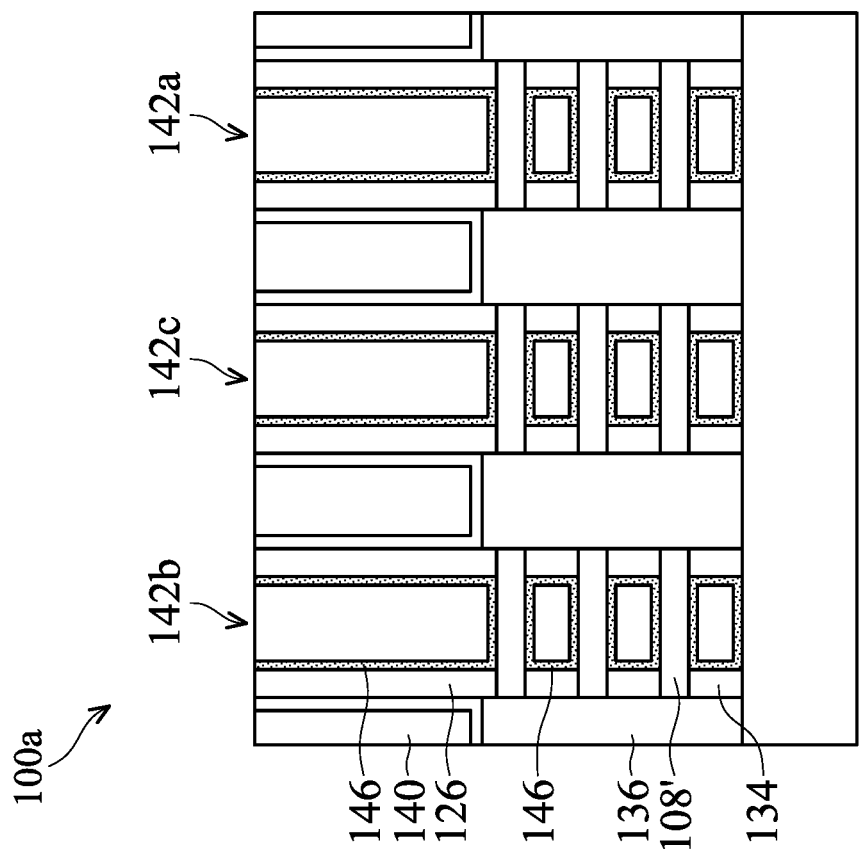
FIG. 2G-2
FIG. 2G-1

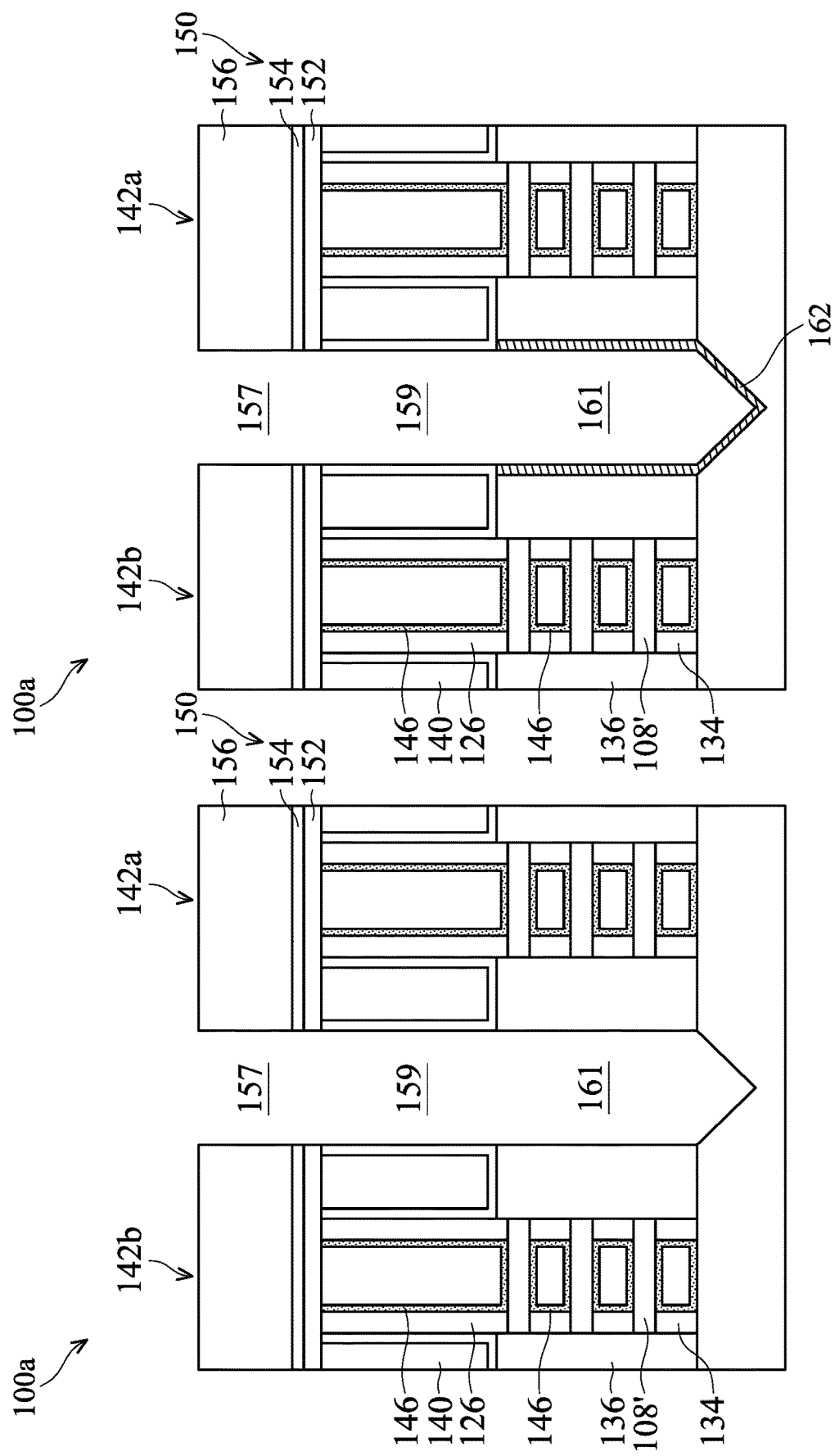

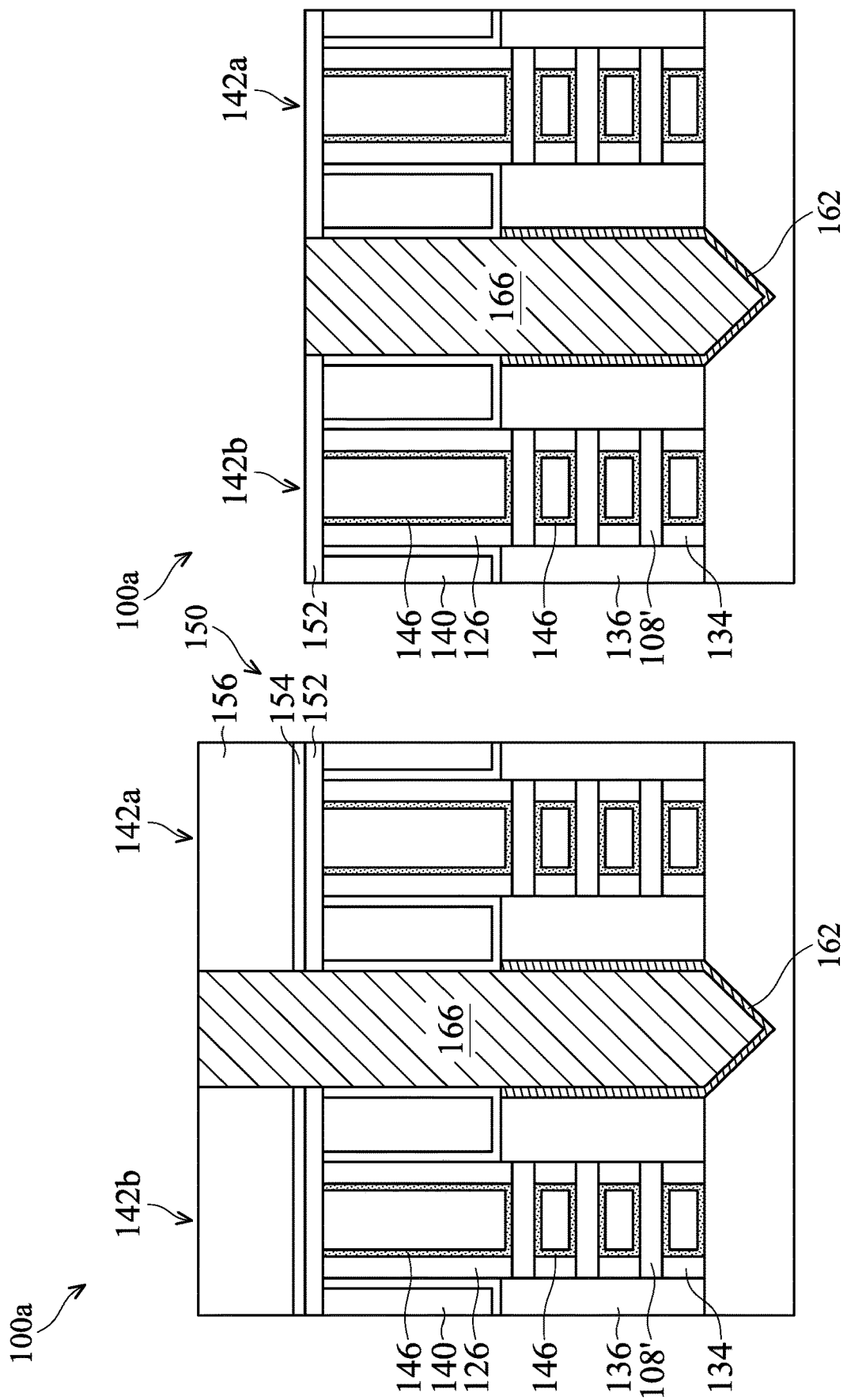

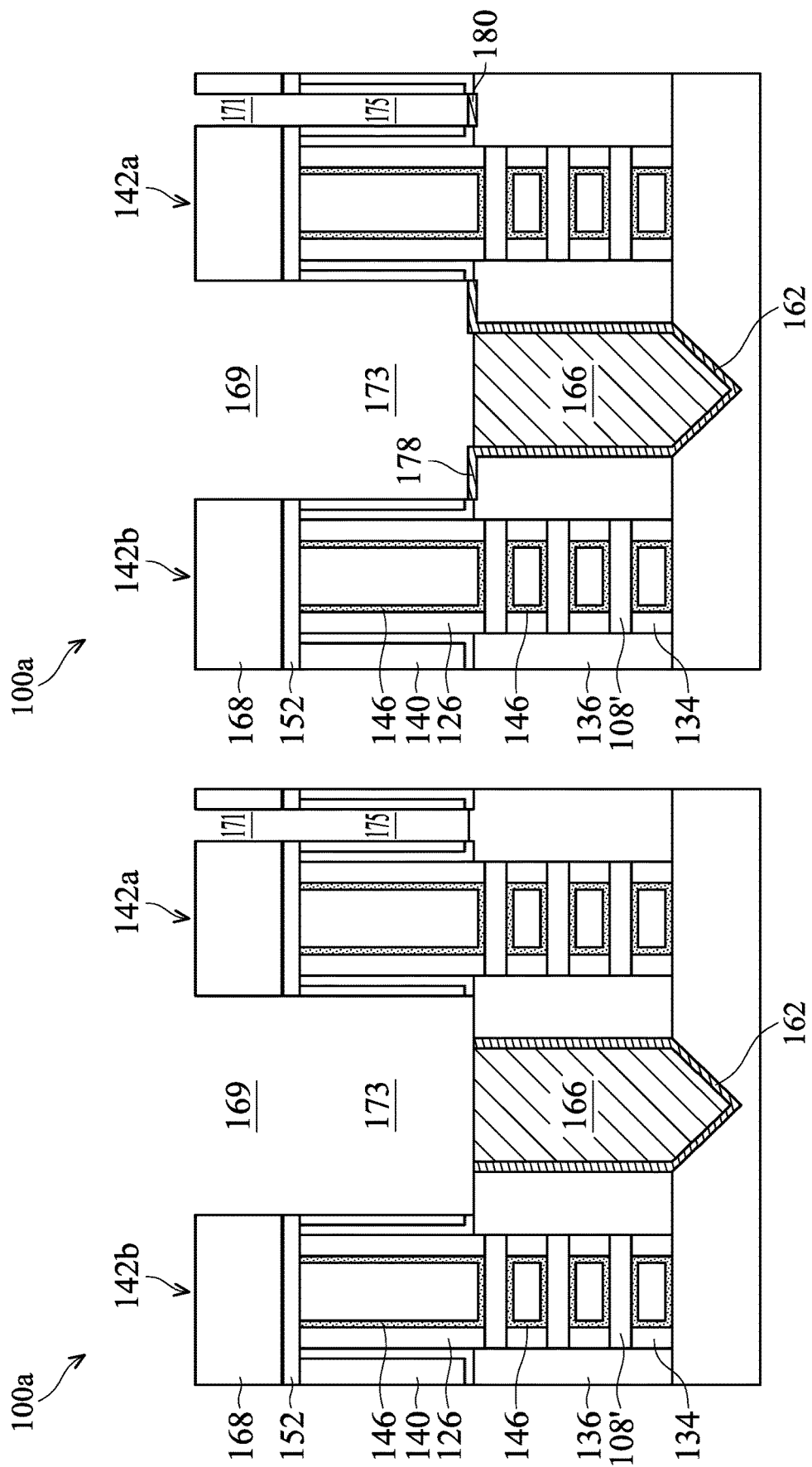

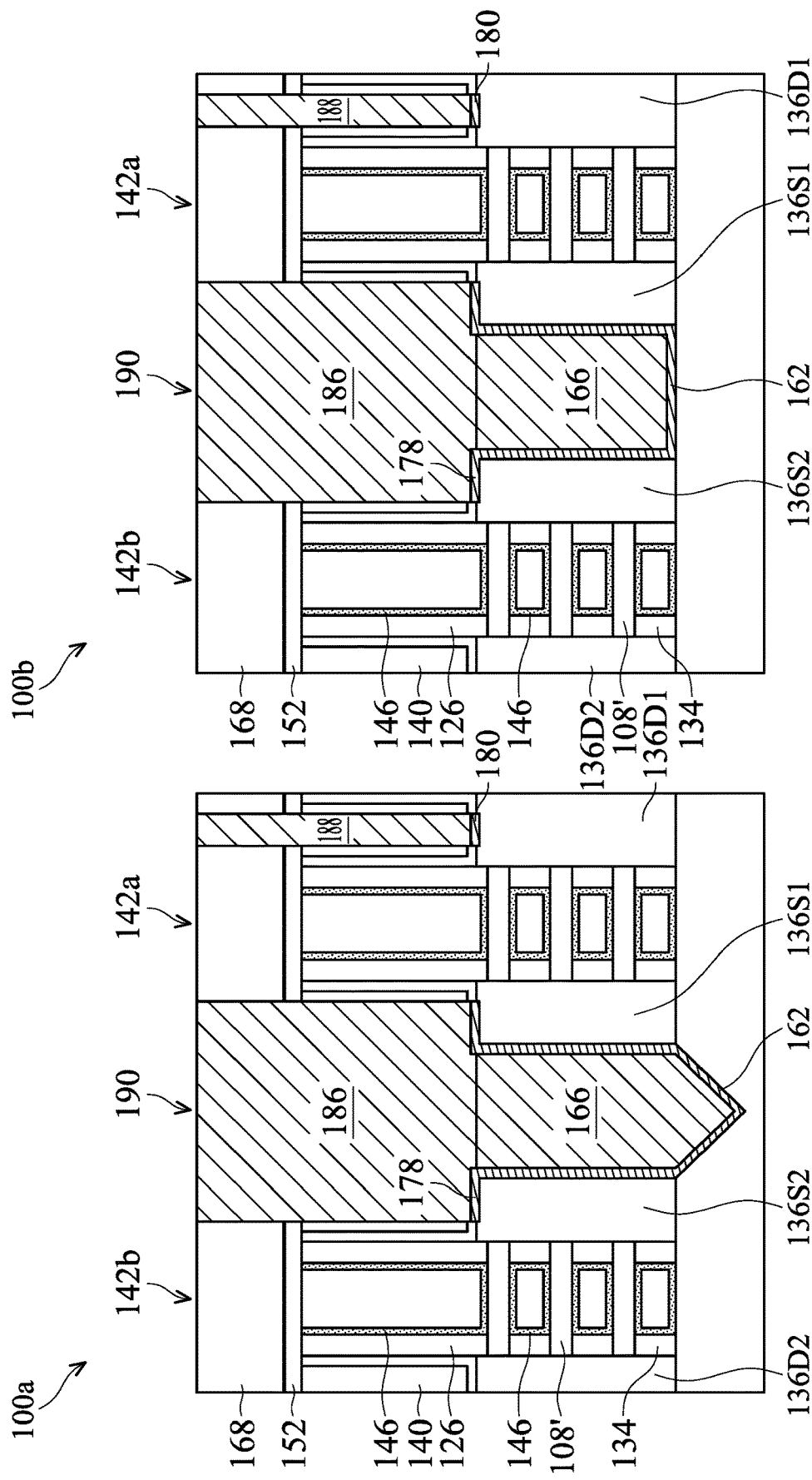

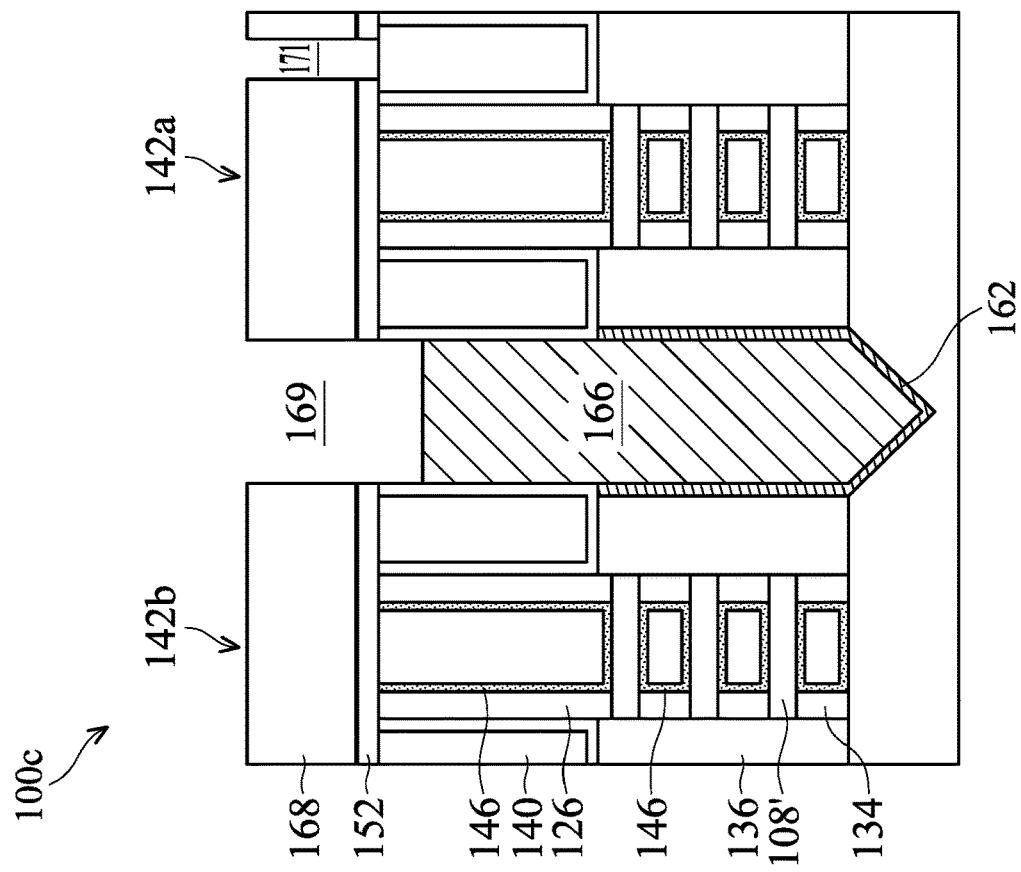
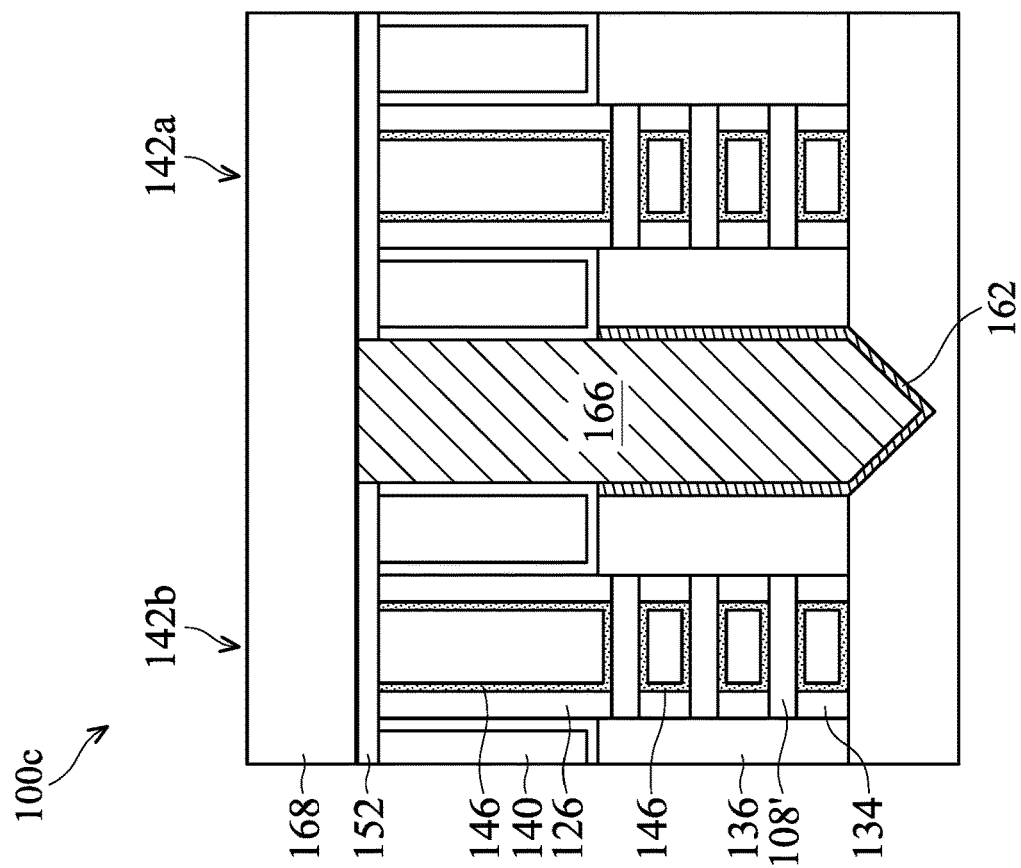

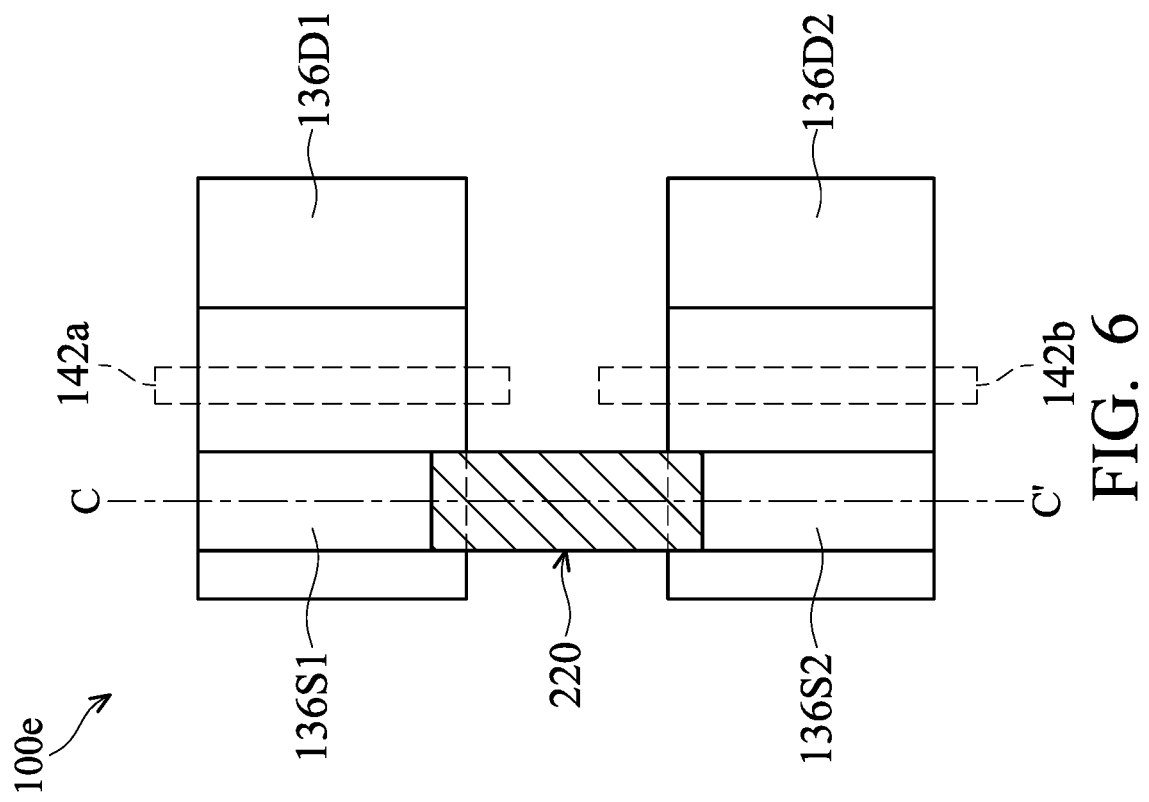

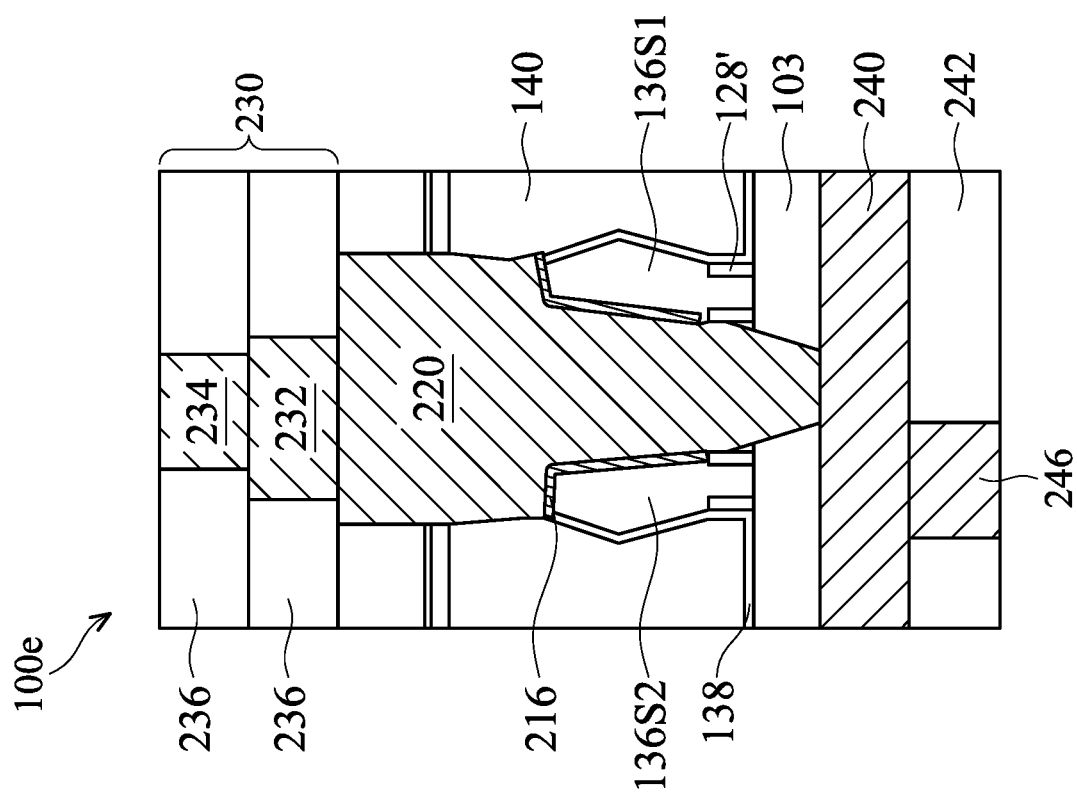
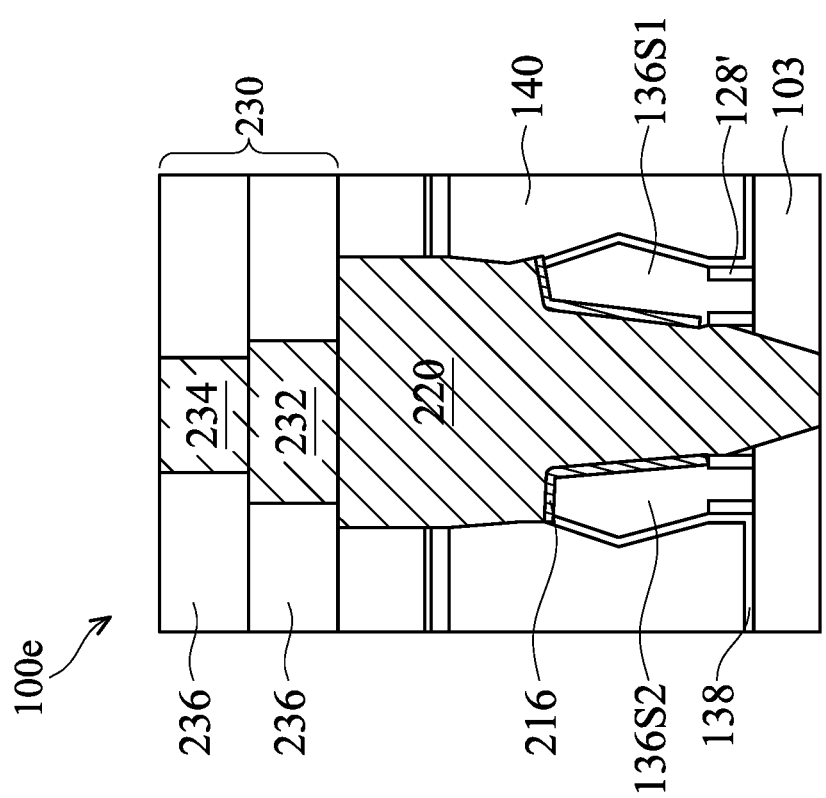
FIG. 7M
FIG. 7N

SEMICONDUCTOR STRUCTURE WITH CONDUCTIVE STRUCTURE

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 2A-1 to 2T-1 show cross-sectional representations of various stages of manufacturing the semiconductor structure shown along line A-A' in FIG. 1E in accordance with some embodiments.

FIGS. 2A-2 to 2G-2 show cross-sectional representations of various stages of manufacturing the semiconductor structure shown along line B-B' in FIG. 1E in accordance with some embodiments.

FIG. 3 shows a cross-sectional view of a semiconductor device structure, in accordance with some embodiments.

FIGS. 4A-4E show cross-sectional views of another intermediate stage of manufacturing a semiconductor device structure, in accordance with some embodiments.

FIG. 5 shows a cross-sectional view of a semiconductor device structure, in accordance with some embodiments.

FIG. 6 shows a top-view of a semiconductor device structure, in accordance with some embodiments.

DETAILED DESCRIPTION

Figure 1A:
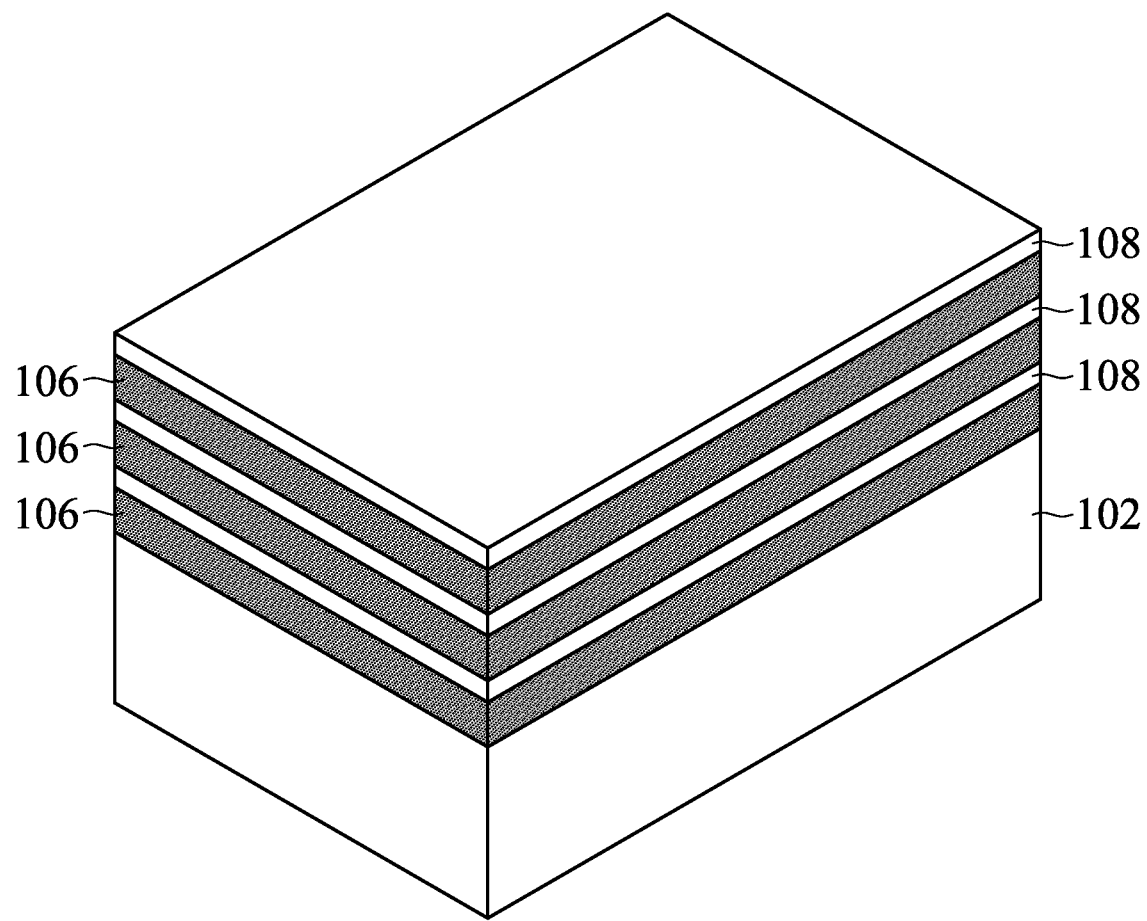
FIGS. 1A to 1E show perspective views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fins described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of semiconductor structures and methods for forming the same are provided. The semiconductor structures may include a gate structure formed over nanostructures and a source/drain (S/D) structure formed adjacent to the gate structure. An S/D contact structure is formed over the S/D structure, and the S/D contact structure is formed on the sidewall surfaces and the top surface of the S/D structure. The bottom surface of the S/D contact structure is lower than the bottommost nanostructure. Since the contact area between the S/D structure and the contact structure is increased, the resistance of the contact structure is reduced. Therefore, the performance of the semiconductor device structure is improved.

FIGS. 1A to 1E show perspective views of intermediate stages of manufacturing a semiconductor structure 100a in accordance with some embodiments. As shown in FIG. 1A, first semiconductor material layers 106 and second semiconductor material layers 108 are formed over a substrate 102.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although three first semiconductor material layers 106 and three second semiconductor material layers 108 are formed, the semiconductor structure may include more or fewer first semiconductor material layers 106 and second semiconductor material layers 108. For example, the semiconductor structure may include two to five of the first semiconductor material layers 106 and the second semiconductor material layers.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Figure 1B:
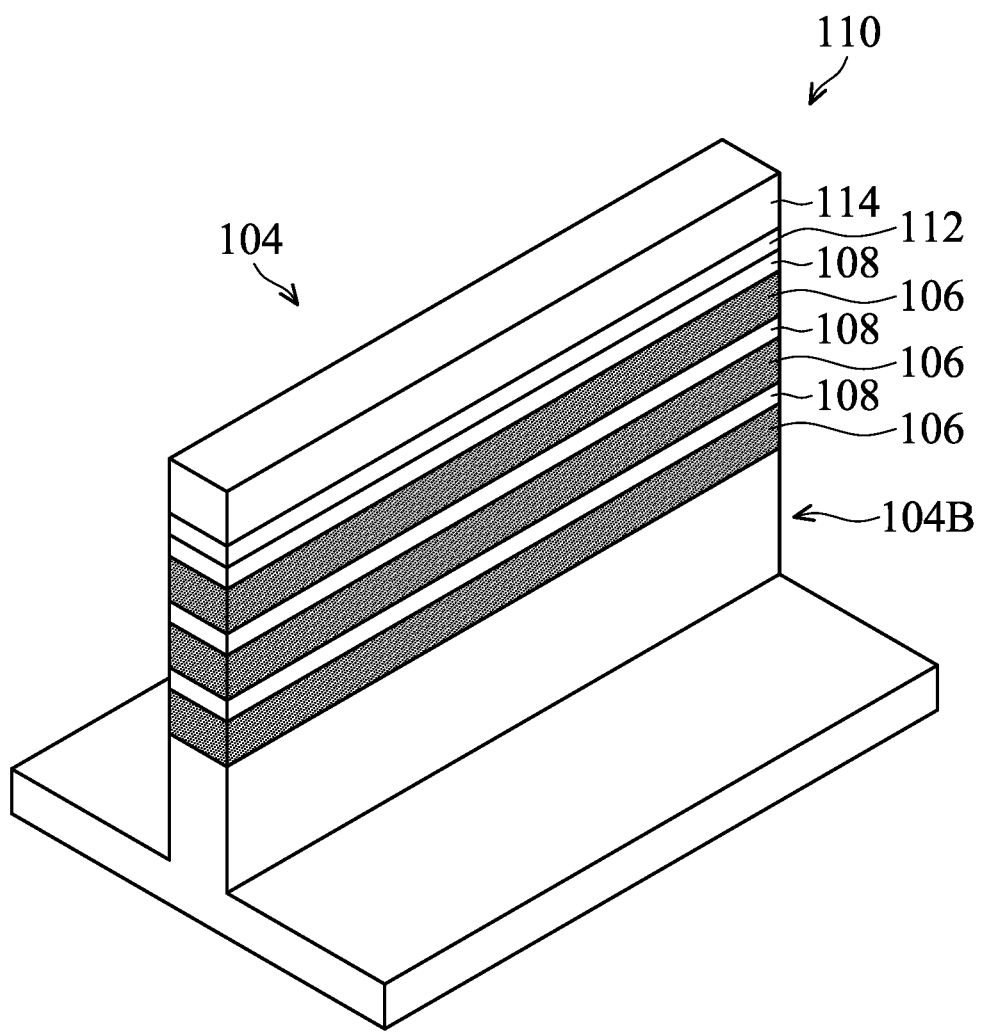

As shown in FIG. 1B, after the first semiconductor material layers 106 and the second semiconductor material layers 108 are formed as a semiconductor material stack over the substrate 102, the semiconductor material stack is patterned to form a fin structure 104, in accordance with some embodiments. In some embodiments, the fin structure 104 includes a base fin structure 104B and the semiconductor material stack of the first semiconductor material layers 106 and the second semiconductor material layers 108.

In some embodiments, the patterning process includes forming a mask structure 110 over the semiconductor material stack, and etching the semiconductor material stack and the underlying substrate 102 through the mask structure 110. In some embodiments, the mask structure 110 is a multilayer structure including a pad oxide layer 112 and a nitride layer 114 formed over the pad oxide layer 112. The pad oxide layer 112 may be made of silicon oxide, which is formed by thermal oxidation or chemical vapor deposition (CVD), and the nitride layer 114 may be made of silicon nitride, which is formed by chemical vapor deposition (CVD), such as low-temperature chemical vapor deposition (LPCVD) or plasma-enhanced CVD (PECVD).

Figure 1C:
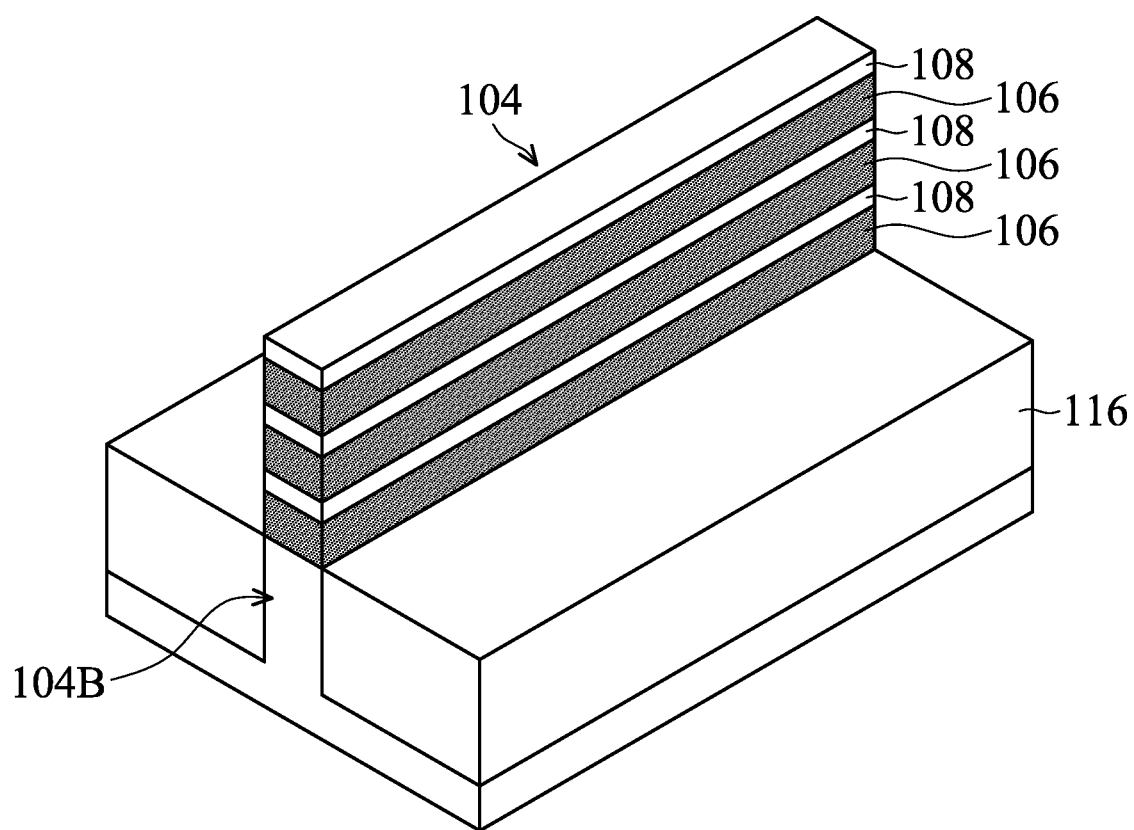

As shown in FIG. 1C, after the fin structure 104 is formed, an isolation structure 116 is formed around the fin structure 104, and the mask structure 110 is removed, in accordance with some embodiments. The isolation structure 116 is configured to electrically isolate active regions (e.g. the fin structure 104) of the semiconductor structure 100 and is also referred to as shallow trench isolation (STI) feature in accordance with some embodiments.

The isolation structure 116 may be formed by depositing an insulating layer over the substrate 102 and recessing the insulating layer so that the fin structure 104 is protruded from the isolation structure 116. In some embodiments, the isolation structure 116 is made of silicon oxide, silicon nitride, silicon oxynitride (SiON), another suitable insulating material, or a combination thereof. In some embodiments, a dielectric liner (not shown) is formed before the isolation structure 116 is formed, and the dielectric liner is made of silicon nitride and the isolation structure formed over the dielectric liner is made of silicon oxide.

Figure 1D:
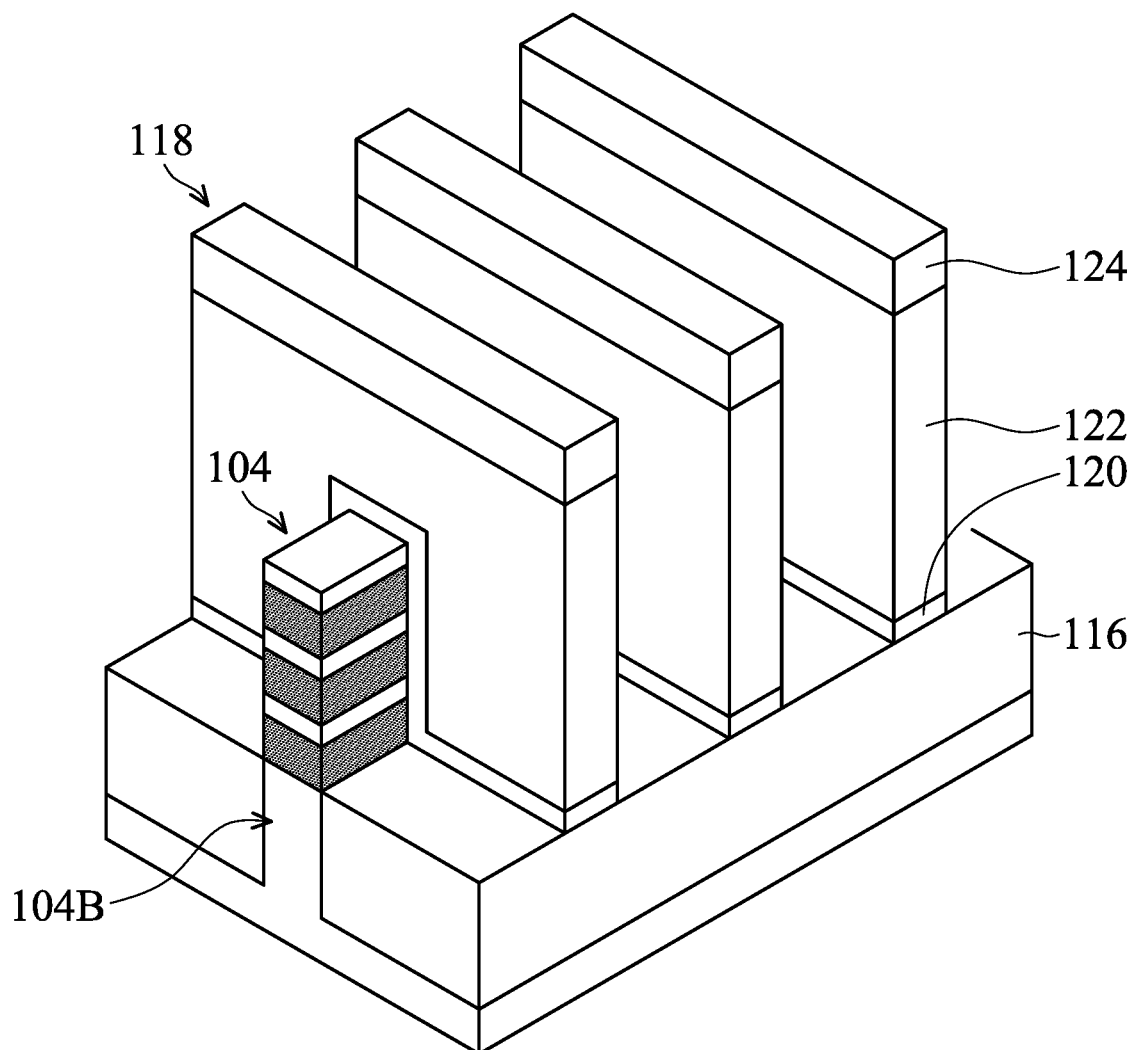

As shown in FIG. 1D, after the isolation structure 116 is formed, dummy gate structures 118 are formed across the fin structure 104 and extend over the isolation structure 116, in accordance with some embodiments. The dummy gate structures 118 may be used to define the source/drain regions and the channel regions of the resulting semiconductor structure 100.

In some embodiments, the dummy gate structures 118 include dummy gate dielectric layers 120 and dummy gate electrode layers 122. In some embodiments, the dummy gate dielectric layers 120 are made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layers 120 are formed using thermal oxidation, chemical vapor deposition (CVD), atomic vapor deposition (ALD), physical vapor deposition (PVD), another suitable method, or a combination thereof.

In some embodiments, the conductive material includes polycrystalline-silicon (poly-Si), poly-crystalline silicon-germanium (poly-SiGe), metallic nitrides, metallic silicides, metals, or a combination thereof. In some embodiments, the dummy gate electrode layers 122 are formed using chemical vapor deposition (CVD), physical vapor deposition (PVD), or a combination thereof.

In some embodiments, hard mask layers 124 are formed over the dummy gate structures 118. In some embodiments, the hard mask layers 124 include multiple layers, such as an oxide layer and a nitride layer. In some embodiments, the oxide layer is silicon oxide, and the nitride layer is silicon nitride.

The formation of the dummy gate structures 118 may include conformally forming a dielectric material as the dummy gate dielectric layers 120. Afterwards, a conductive material may be formed over the dielectric material as the dummy gate electrode layers 122, and the hard mask layer 124 may be formed over the conductive material. Next, the dielectric material and the conductive material may be patterned through the hard mask layer 124 to form the dummy gate structures 118.

Figure 1E:
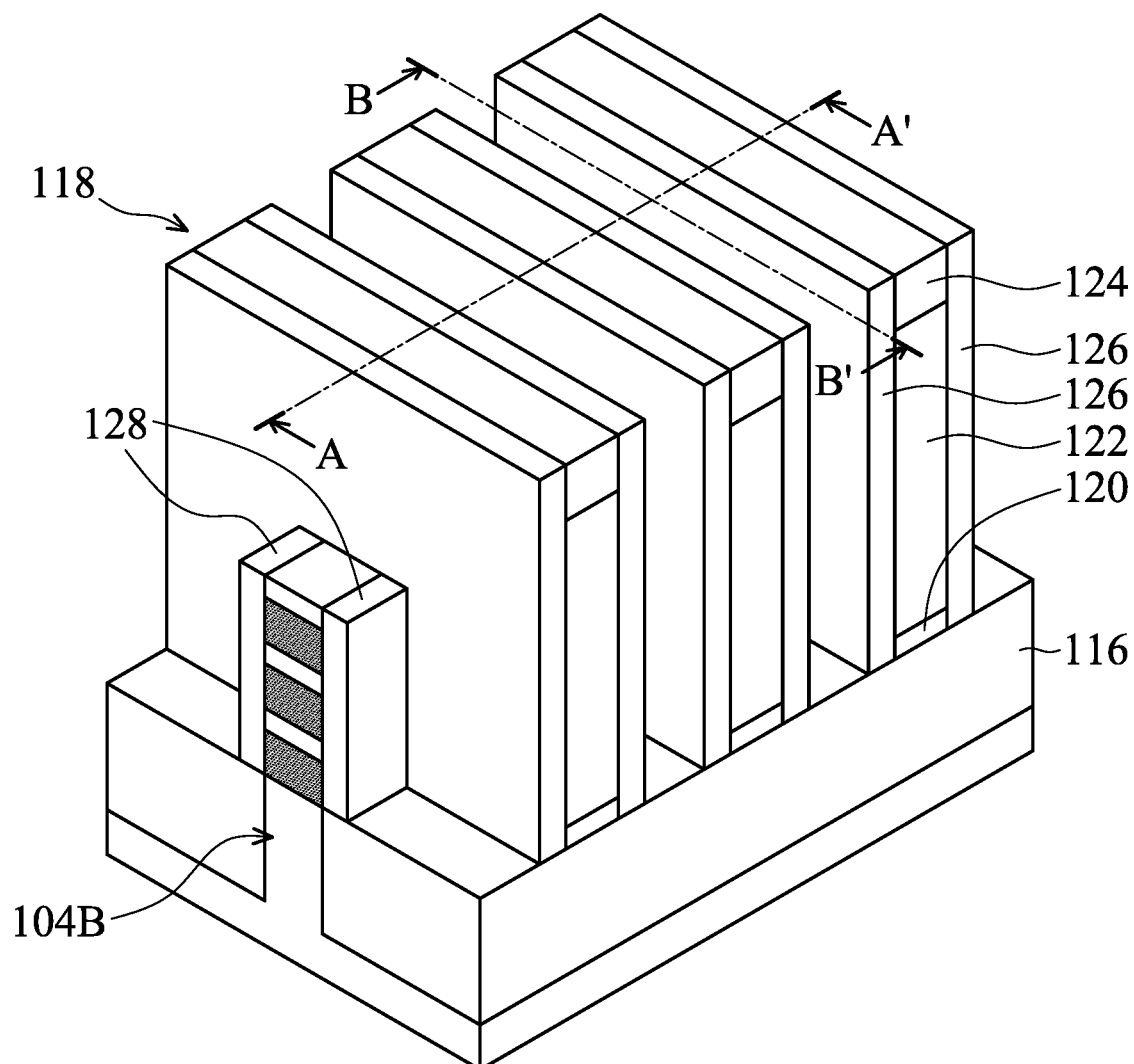

As shown in FIG. 1E, after the dummy gate structures 118 are formed, gate spacers 126 are formed along and covering opposite sidewalls of the dummy gate structure 118 and fin spacers 128 are formed along and covering opposite sidewalls of the source/drain regions of the fin structure 104, in accordance with some embodiments.

The gate spacers 126 may be configured to separate source/drain structures from the dummy gate structure 118 and support the dummy gate structure 118, and the fin spacers 128 may be configured to constrain a lateral growth of subsequently formed source/drain structure and support the fin structure 104.

In some embodiments, the gate spacers 126 and the fin spacers 128 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. The formation of the gate spacers 126 and the fin spacers 128 may include conformally depositing a dielectric material covering the dummy gate structure 118, the fin structure 104, and the isolation structure 116 over the substrate 102, and performing an anisotropic etching process, such as dry plasma etching, to remove the dielectric layer covering the top surfaces of the dummy gate structure 118, the fin structure 104, and portions of the isolation structure 116.

Figures 1, 2, 2B:
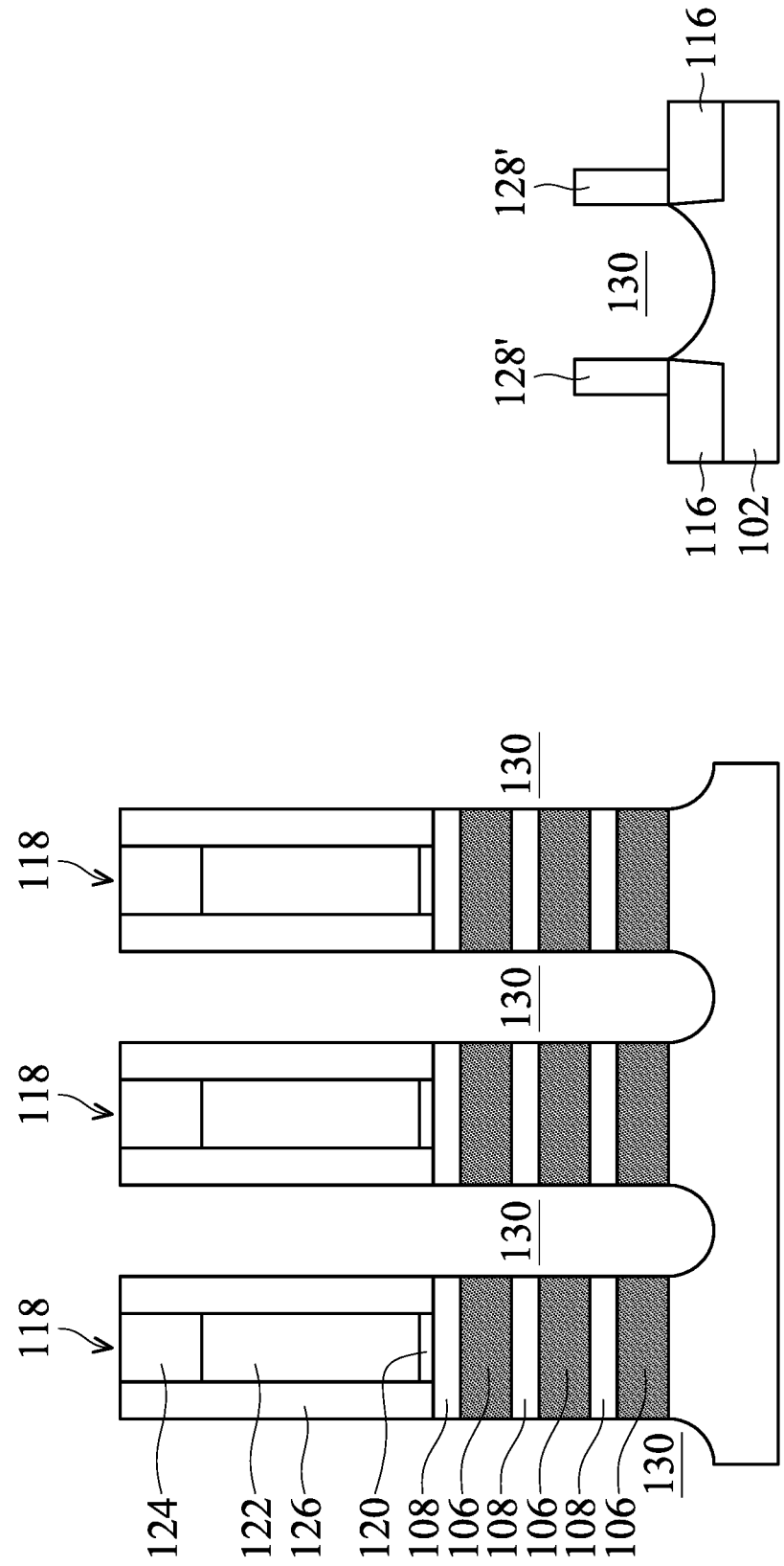

FIGS. 2A-1 to 2T-1 show cross-sectional representations of various stages of manufacturing the semiconductor structure 100*a* shown along line A-A' in FIG. 1E in accordance with some embodiments. FIGS. 2A-2 to 2G-2 show cross-sectional representations of various stages of manufacturing the semiconductor structure 100*a* shown along line B-B' in FIG. 1E in accordance with some embodiments. More specifically, FIG. 2A-1 shows the cross-sectional representation shown along line A-A' and FIG. 2A-2 shows the cross-sectional representation shown along line B-B' in FIG. 1E in accordance with some embodiments.

As shown in FIGS. 2B-1 and 2B-2, after the gate spacers 126 and the fin spacers 128 are formed, the source/drain (S/D) regions of the fin structure 104 are recessed to form source/drain (S/D) recesses 130, as shown in accordance with some embodiments. More specifically, the first semiconductor material layers 106 and the second semiconductor material layers 108 not covered by the dummy gate structures 118 and the gate spacers 126 are removed in accordance with some embodiments. In addition, some portions of the base fin structure 104B are also recessed to form curved top surfaces, as shown in FIG. 2B-1 in accordance with some embodiments.

In some embodiments, the fin structure 104 is recessed by performing an etching process. The etching process may be an anisotropic etching process, such as dry plasma etching, and the dummy gate structure 118 and the gate spacers 126 are used as etching masks during the etching process. In some embodiments, the fin spacers 128 are also recessed to form lowered fin spacers 128'.

Afterwards, as shown in FIGS. 2C-1 and 2C-2, after the source/drain recesses 130 are formed, the first semiconductor material layers 106 exposed by the source/drain recesses 130 are laterally recessed to form notches 132, in accordance with some embodiments.

In some embodiments, an etching process is performed on the semiconductor structure 100 to laterally recess the first semiconductor material layers 106 of the fin structure 104 from the source/drain recesses 130. In some embodiments, during the etching process, the first semiconductor material layers 106 have a greater etching rate (or etching amount) than the second semiconductor material layers 108, thereby forming notches 132 between adjacent second semiconductor material layers 108. In some embodiments, the etching process is an isotropic etching such as dry chemical etching, remote plasma etching, wet chemical etching, another suitable technique, and/or a combination thereof.

Figures 1, 2, 2D:
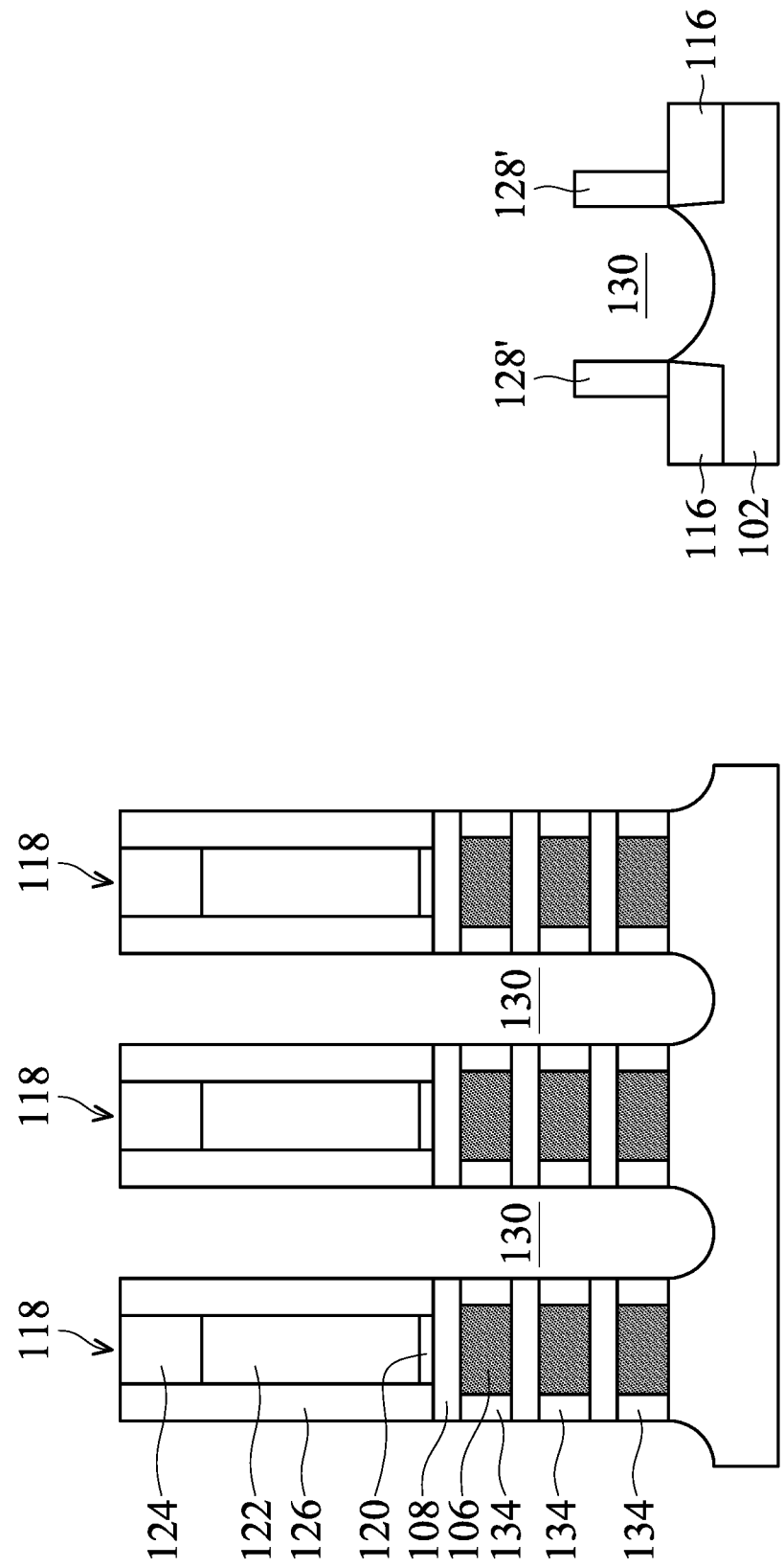

Next, as shown in FIGS. 2D-1 and 2D-2, inner spacers 134 are formed in the notches 132 between the second semiconductor material layers 108, in accordance with some embodiments. The inner spacers 134 are configured to separate the source/drain structures and the gate structures formed in subsequent manufacturing processes in accordance with some embodiments. In some embodiments, the inner spacers 134 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the inner spacer layer 134 is formed by a deposition process, such as chemical vapor deposition (CVD) process, atomic layer deposition (ALD) process, another applicable process, or a combination thereof.

Figures 1, 2E:
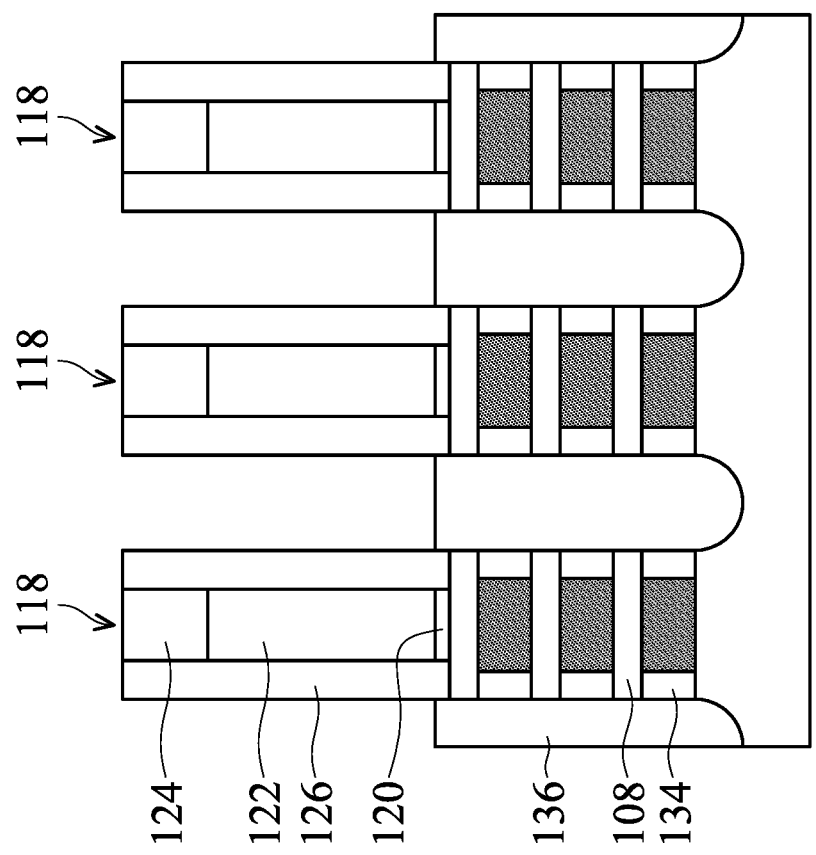
Figures 2, 2E:
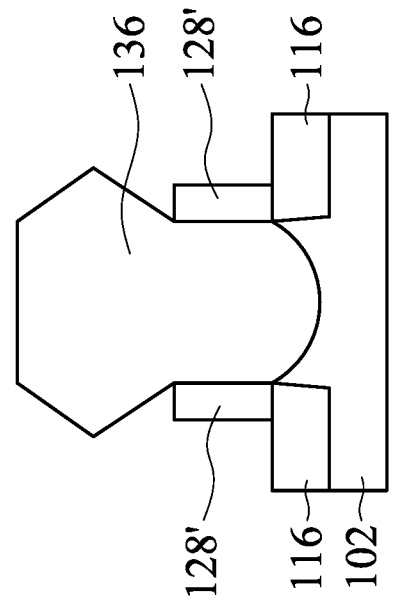

Afterwards, as shown in FIGS. 2E-1 and 2E-2, after the inner spacers 134 are formed, source/drain (S/D) structures 136 are formed in the S/D recesses 130, in accordance with some embodiments. In some embodiments, the S/D structures 136 are formed using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof. In some embodiments, the S/D structures 136 are made of any applicable material, such as Ge, Si, GaAs, AlGaAs, SiGe, GaAsP, SiP, SiC, SiCP, or a combination thereof.

In some embodiments, the S/D structures 136 are in-situ doped during the epitaxial growth process. For example, the S/D structures 136 may be the epitaxially grown SiGe doped with boron (B). For example, the S/D structures 136 may be the epitaxially grown Si doped with carbon to form silicon: carbon (Si:C) source/drain features, phosphorous to form silicon:phosphor (Si:P) source/drain features, or both carbon and phosphorous to form silicon carbon phosphor (SiCP) source/drain features. In some embodiments, the S/D structures 136 are doped in one or more implantation processes after the epitaxial growth process.

Next, as shown in FIGS. 2F-1 and 2F-2, after the S/D structures 136 are formed, a contact etch stop layer (CESL) 138 is conformally formed to cover the S/D structures 136 and an interlayer dielectric (ILD) layer 140 is formed over the contact etch stop layers 138, in accordance with some embodiments.

In some embodiments, the CESL 138 is made of a dielectric materials, such as silicon nitride, silicon oxide, silicon oxynitride, another suitable dielectric material, or a combination thereof. The dielectric material for the CESL 138 may be conformally deposited over the semiconductor structure by performing chemical vapor deposition (CVD), ALD, other application methods, or a combination thereof. The ILD layer 140 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The ILD layer 140 may be formed by chemical vapor deposition (CVD), physical vapor deposition, (PVD), atomic layer deposition (ALD), or other applicable processes.

After the CESL 138 and the ILD layer 140 are deposited, a planarization process such as CMP or an etch-back process may be performed until the gate electrode layers 120 of the dummy gate structures 118 are exposed, as shown in FIG. 2F-1 in accordance with some embodiments.

Afterwards, as shown in FIGS. 2G-1 and 2G-2, the dummy gate structures 118 are replaced by a first gate structure 142*a*, a second gate structure 142*b* and a third gate structure 142*c*, in accordance with some embodiments. The third gate structure 142*c* is between the first gate structure 142*a* and the second gate structure 142*b*. The first gate structure 142*a*, the second gate structure 142*b* and the third gate structure 142*c* are arranged parallel to each other.

More specifically, the dummy gate structures 118 and the first semiconductor material layers 106 are removed to form nanostructures 108' with the second semiconductor material layers 108, in accordance with some embodiments. The S/D structure 136 is attached to the nanostructures 108'.

The removal process may include one or more etching processes. For example, when the dummy gate electrode layers 122 are polysilicon, a wet etchant such as a tetramethylammonium hydroxide (TMAH) solution may be used to selectively remove the dummy gate electrode layers 122. Afterwards, the dummy gate dielectric layers 120 may be removed using a plasma dry etching, a dry chemical etching, and/or a wet etching. The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions. In some embodiments, the upper portions of the gate spacers 126 are also removed.

After the nanostructures 108' are formed, the gate structures 142a, 142b, 142c are formed wrapped around the nanostructures 108'. The gate structures 142a, 142b, 142c wrap around the nanostructures 108' to form gate-all-around transistor structures in accordance with some embodiments. In some embodiments, each of the gate structures 142a, 142b, 142c includes an interfacial layer 144, a gate dielectric layer 146, and a gate electrode layer 148.

In some embodiments, the interfacial layers 144 are oxide layers formed around the nanostructures 108' and on the top of the base fin structure 104B. In some embodiments, the interfacial layers 144 are formed by performing a thermal process.

In some embodiments, the gate dielectric layers 146 are formed over the interfacial layers 144, so that the nanostructures 108' are surrounded (e.g. wrapped) by the gate dielectric layers 146. In addition, the gate dielectric layers 146 also cover the sidewalls of the gate spacers 126 and the inner spacers 134 in accordance with some embodiments. In some embodiments, the gate dielectric layers 146 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al2O_3$) alloy, another suitable high-k dielectric material, or a combination thereof. In some embodiments, the gate dielectric layers 146 are formed using chemical vapor deposition (CVD), atomic layer deposition (ALD), another applicable method, or a combination thereof.

In some embodiments, the gate electrode layers 148 are formed on the gate dielectric layer 146. In some embodiments, the gate electrode layers 148 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layers 148 are formed using chemical vapor deposition (CVD), atomic layer deposition (ALD), electroplating, another applicable method, or a combination thereof. Other conductive layers, such as work function metal layers, may also be formed in the gate structures 142, although they are not shown in the figures. In some embodiments, the n-work function layer includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof.

After the interfacial layers 144, the gate dielectric layers 146, and the gate electrode layers 148 are formed, a planarization process such as CMP or an etch-back process may be performed until the ILD layer 140 is exposed.

Figures 1, 2H, 2I:
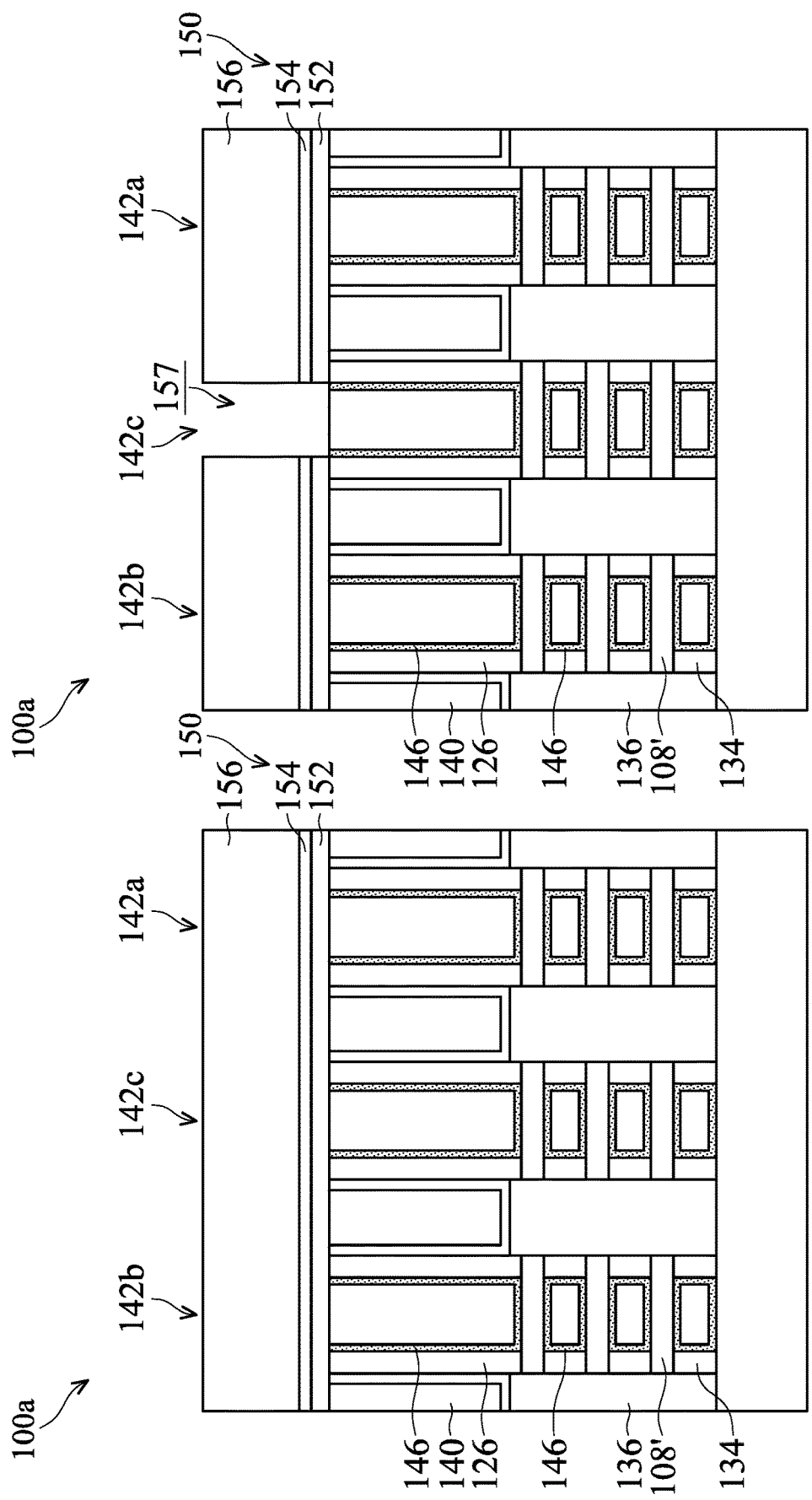

Afterwards, as shown in FIGS. 2H-1, a mask structure 150 is formed over the gate structure 142 and the ILD layer 140, in accordance with some embodiments. In some embodiments, the mask structure 150 includes a first mask layer 152, a second mask layer 154 and a third mask layer 156. In some embodiments, the first mask layer 152 is made of silicon nitride (SiN), the second mask layer 154 is made of amorphous silicon (a-Si), and the third mask layer 156 is made of silicon nitride (SiN).

Next, as shown in FIG. 2I-1, the mask structure 150 is patterned to form an opening 157 over the third gate structure 142c, in accordance with some embodiments. The top surface of the gate electrode 148 and the top surface of the gate dielectric layer 146 are exposed by the opening 157. In some embodiments, the mask structure 150 is patterned by an etching process, such as a dry etching process or a wet etching process.

Figures 1, 2J, 2K:
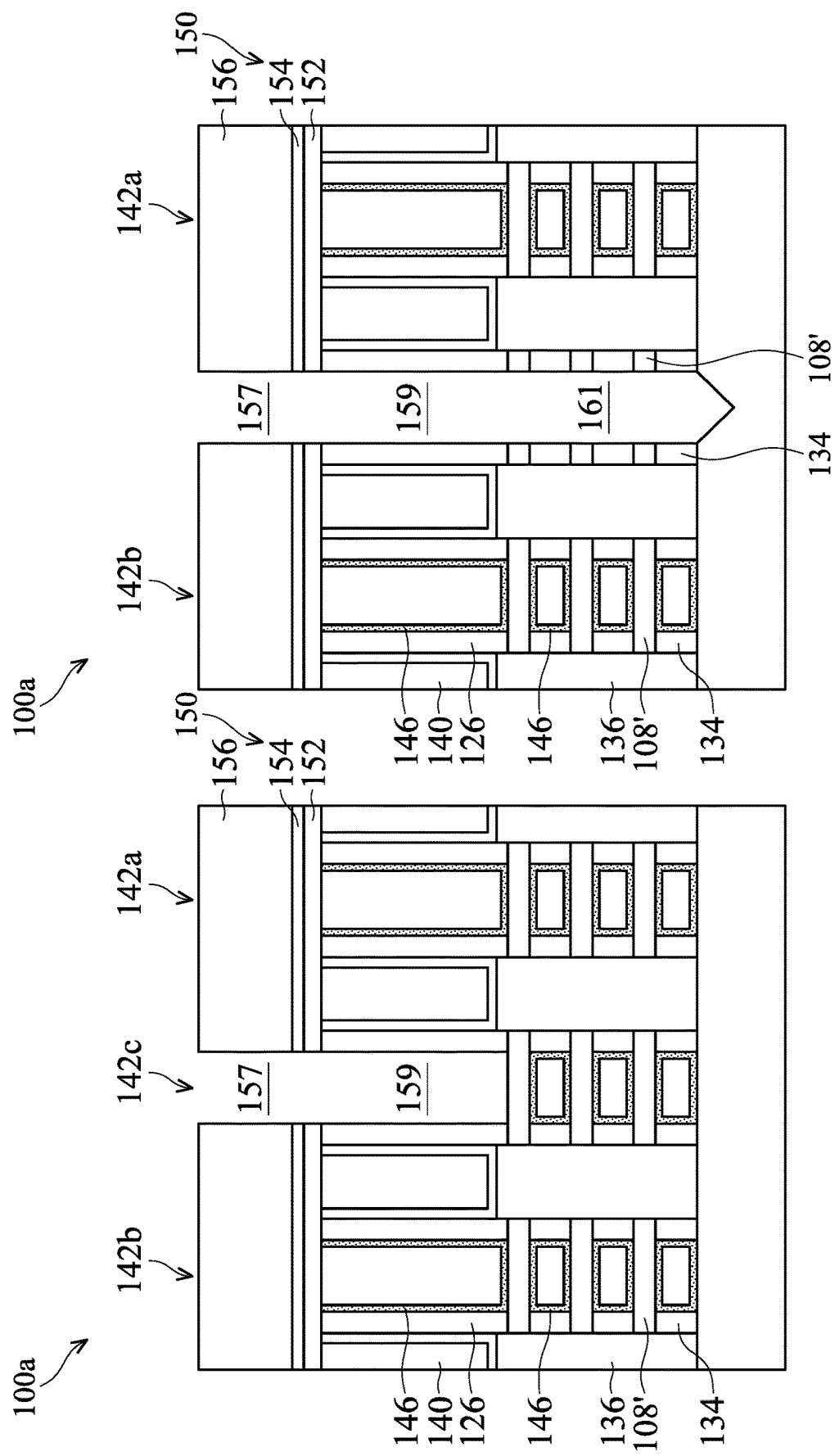

Afterwards, as shown in FIG. 2J-1, a portion of the gate electrode 148 of the third gate structure 142c is removed, and a portion of the gate dielectric layer 146 of the third gate structure 142c is removed to form a trench 159, in accordance with some embodiments. As a result, the top surface of the nanostructures 108' is exposed. In some embodiments, the trench 159 is formed by an etching process, such as a dry etching process or a wet etching process.

Next, as shown in in FIG. 2K-1, a remaining portion of the gate electrode 148 of the third gate structure 142c is removed, and a remaining portion of the gate dielectric layer 146 of the third gate structure 142c are removed to form a trench 161, in accordance with some embodiments. The trench 159 is connected to the trench 161. The bottom surface of the trench 161 is lower than the bottom surface of the S/D structure 136. In addition, a sidewall of the inner spacer 134 is exposed by the trench 161. In some embodiments, the trench 161 is formed by an etching process, such as a dry etching process or a wet etching process.

Afterwards, as shown in FIG. 2L-1, the gate spacer 126, the nanostructure 108' and the inner spacer 134 is removed to expose a sidewall of the S/D structure 136, in accordance with some embodiments. In addition, the CESL 138 is exposed by the trench 159. In some embodiments, the gate spacer 126, the nanostructure 108' and the inner spacer 134 are removed by an etching process, such as a dry etching process or a wet etching process.

Next, as shown in FIG. 2M-1, the bottom silicide layer 162 is formed on the sidewall of the S/D structure 136 and on substrate 102, in accordance with some embodiments. A portion of the bottom silicide layer 162 is lower than the bottom surface of the S/D structure 136, and the bottom surface of the bottom silicide layer 162 is lower than the bottom surface of the S/D structure 136. In addition, a portion of the bottom silicide layer 162 is lower than the bottommost nanostructure 108'. In some other embodiments, before forming the bottom silicide layer 162, an implant process is performed to dope the S/D structure 136. The bottom silicide layer 162 is directly below the CESL 138.

The bottom silicide layer 162 may be formed by forming a metal layer over the top surface of the S/D structure 136 and annealing the metal layer so the metal layer reacts with the S/D structure 136 to form the bottom silicide layer 162. The unreacted metal layer may be removed after the bottom silicide layer 162 is formed. In some embodiments, the bottom silicide layer 162 is made of nickel silicide (NiS), cobalt silicide (CoSi), copper silicide (CuSi), tantalum silicide (TaSi), or another applicable material.

Next, as shown in FIG. 2N, a bottom contact structure 166 is formed in the opening 157, the trench 159 and the trench 161, in accordance with some embodiments. The bottom contact structure 166 is formed on the bottom silicide layer 162 and the CESL 138. The bottom surface of the bottom contact structure 166 is lower than the bottom surface of the S/D structure 136. The bottom surface of the bottom contact structure 166 is lower than the nanostructure 108'.

In some embodiments, the bottom contact structure 166 is made of a conductive material including aluminum (Al), copper (Cu), tungsten (W), titanium (Ti), tantalum (Ta), titanium nitride (TiN), cobalt, tantalum nitride (TaN), tantalum carbide nitride (TaCN), titanium aluminide (TiAl), titanium aluminum nitride (TiAlN), other applicable conductive materials, or a combination thereof. In some embodiments, the bottom contact structure 166 may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

Afterwards, as shown in FIG. 2O-1, a top portion of the bottom contact structure 166 is removed, in accordance with some embodiments. In addition, the second mask layer 154 and the third mask layer 156 are removed. In some embodiments, the top portion of the bottom contact structure 166 is removed by a planarization process, such as CMP process.

Figures 1, 2Q:
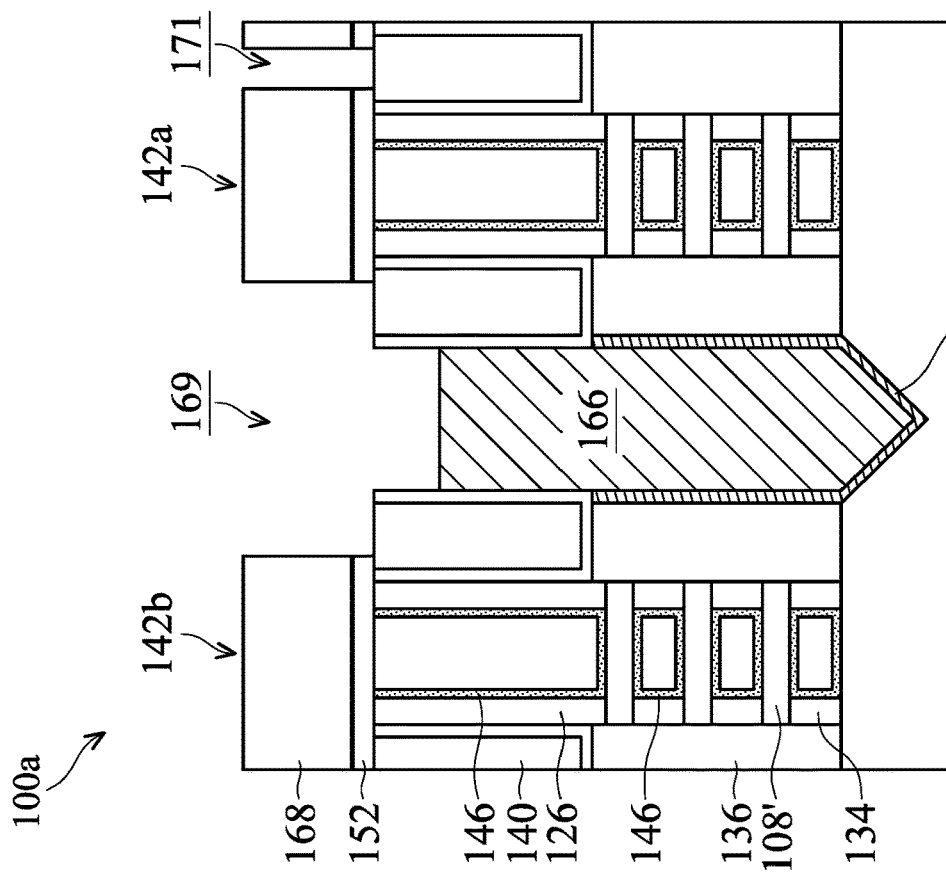
Figures 1, 2P:
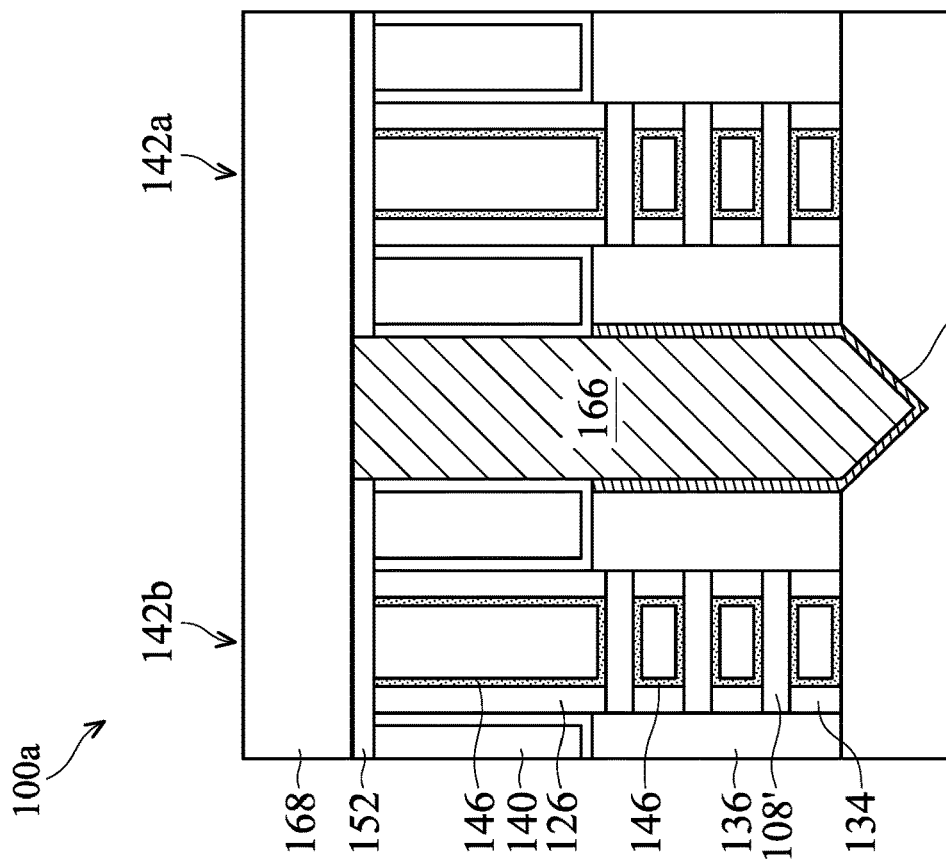

Next, as shown in FIG. 2P-1, a dielectric layer 168 is formed over the first hard mask layer 152, in accordance with some embodiments. The material of the dielectric layer 168 and the material of the first mask layer 152 may be the same or different. In some embodiments, the dielectric layer 168 and the first mask layer 152 both are made of silicon nitride (SiN).

In some embodiments, the dielectric layer 168 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The dielectric layer 168 may be formed by chemical vapor deposition (CVD), physical vapor deposition, (PVD), atomic layer deposition (ALD), or other applicable processes.

Next, as shown in FIG. 2Q-1, the dielectric layer 168 is patterned to form a first opening 169 over the bottom contact structure 166 and a second opening 171 adjacent to the first opening 169, in accordance with some embodiments. The width of the first opening 169 is greater than the width of the second opening 171. Furthermore, a portion of the bottom contact structure 166 is removed, and the top surface of the bottom contact structure 166 is lower than the top surface of the ILD layer 140.

Afterwards, as shown in FIG. 2R-1, the top portion of the ILD layer 140 and a portion of the CESL 138 are removed to form a first trench 173 and a second trench 175, in accordance with some embodiments. The first opening 169 is connected to the first trench 173, and the second opening 171 is connected to the second trench 175. As a result, the top surface of the S/D structure 136 is exposed. The width of the first trench 173 is greater than the width of the second width 175.

Next, as shown in in FIG. 2S, a top silicide layer 178 is formed in the first trench 173 and on the exposed S/D structure 136, and the top silicide layer 178 is connected to the bottom silicide layer 162, in accordance with some embodiments. Another top silicide layer 180 is formed in the second trench 175 and on the exposed S/D structure 136.

The top silicide layer 178 may be formed by forming a metal layer over the top surface of the S/D structures 136 and annealing the metal layer so the metal layer reacts with the S/D structures 136 to form the top silicide layer 178. The unreacted metal layer may be removed after the top silicide layer 178 is formed. In some embodiments, the top silicide layer 178 is made of nickel silicide (NiS), cobalt silicide (CoSi), copper silicide (CuSi), tantalum silicide (TaSi), or another applicable material.

Afterwards, as shown in FIG. 2T-1, a top contact structure 186 is formed over the bottom contact structure 166, and another S/D contact structure 188 is formed on the top silicide layer 180, in accordance with some embodiments. An S/D contact structure 190 is constructed by the top contact structure 186 and the bottom contact structure 166. The height of the S/D contact structure 190 is greater than the height of the S/D contact structure 188. Furthermore, the S/D contact structure 190 has a T-shaped structure.

In some embodiments, when the top contact structure 186 and the bottom contact structure 166 are made of different materials, an interface is between top contact structure 186 and the bottom contact structure 166. In some other embodiments, when the top contact structure 186 and the bottom contact structure 166 are made of the same materials, an unclear interface is between top contact structure 186 and the bottom contact structure 166.

In some embodiments, the top contact structure 186 is made of a conductive material including aluminum (Al), copper (Cu), tungsten (W), titanium (Ti), tantalum (Ta), titanium nitride (TiN), cobalt, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof. In some embodiments, the top contact structure 186 may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

The S/D contact structure 190 is formed by removing the third gate structure 142c (as a dummy gate structure) to form a deep trench, and filling a conductive material into the deep trench. The deep trench is constructed by the trench 161 and the first trench 159, and the bottom surface of the deep trench is lower than the bottommost surface of the first gate structure 142a. By forming the bottom silicide layer 162 and the top silicide layer 178 on sidewall surfaces and top surface of the S/D structure 136 to have large contact area. The large contact area of the bottom silicide layer 162 and the top silicide layer 178 is helpful to form the S/D contact structure 190.

It should be noted that, the S/D contact structure 190 extends from a first position to a second position, the first position is higher than the top surface of the gate structure 142, and the second position is below the bottommost nanostructure 108'. The sidewall surfaces and the top surface of the S/D structure 136 are covered by the top silicide layer 178 and the bottom silicide layer 166. The bottom silicide layer 166 is connected to the top silicide layer 178, and accordingly the silicide layers 166 and 178 become a continuous layer which extends from sidewall surface of the S/D structure 136 to the top surface of the S/D structure 136. Compared with the top silicide layer 180 in the second trench 145, the bottom silicide layer 166 and the top silicide layer 178 in the first trench 173 provide large contact area to form the S/D contact structure 190, and therefore the resistance is reduced.

The bottom surface of the bottom silicide layer 166 is lower than the bottom surface of the top silicide layer 178. The bottommost surface of the bottom silicide layer 166 is lower than the bottommost nanostructure 108'. The bottommost surface of the bottom silicide layer 166 is lower than the bottommost surface of the first gate structure 142a and the second gate structure 142b.

As shown in FIG. 2T-1, the gate structure 142 includes the first gate structure 142a and the second gate structure 142b adjacent to the first gate structure 142a. The first drain structure 136D1 and the first source structure 136S1 are on opposite sides of the first gate structure 142a. The second drain structure 136D2 and the second source structure 136S2 are on opposite sides of the second gate structure 142b. It should be noted that the S/D contact structure 190 is between the first gate structure 142a and the second gate structure 142b. The S/D contact structure 190 is between and is direct contact with the source structure 136S1 and the source structure 136S2. Therefore, the S/D contact structure 184 is a common source structure between two adjacent the first gate structure 142a and the second gate structure 142b. In addition, the bottom surface of another S/D contact structure 188 (or called as drain contact structure) over the drain structure 136D1 is higher than the bottom surface of the S/D contact structure 190 over the source structure 136S1. In addition, the bottom surface of the S/D contact structure 190 is lower than the bottommost nanostructure 108'. The bottom surface of the S/D contact structure 190 is lower than the bottom surface of the S/D structure 136.

Since the S/D contact structure 190 has the top contact structure 186 and the bottom contact structure 166, the contact area of the S/D contact structure 190 is greater than the S/D contact structure 188, the resistance between the S/D structure 136 and the S/D contact structure 190 is reduced. Therefore, the drive current becomes higher and the device speed is faster. Accordingly, the performance of the semiconductor device structure is improved.

FIG. 3 shows a cross-sectional view of a semiconductor device structure 100b, in accordance with some embodiments. The semiconductor device structure 100b of FIG. 3 includes elements that are similar to, or the same as, elements of the semiconductor device structure 100a of FIG. 2T, the difference between FIG. 3 and FIG. 2T is that, bottom surface of the bottom silicide layer 162 has a substantially planar bottom surface and the bottom contact structure 166 does not extend into the substrate 102. In FIG. 2T, the bottom contact structure 166 extends into the substrate 102, and the S/D contact structure 190 has a T-shaped structure.

FIGS. 4A-4E show cross-sectional views of another intermediate stage of manufacturing a semiconductor device structure 100c, in accordance with some embodiments. The semiconductor device structure 100c of FIG. 4A includes elements that are similar to, or the same as, elements of the semiconductor device structure 100a of FIG. 2P-1.

As shown in FIG. 4A, the bottom silicide layer 162 is formed on the sidewall surfaces of the S/D structure 136, and the bottom contact 166 is formed over the bottom silicide layer 162.

Afterwards, as shown in FIG. 4B, the dielectric layer 168 is patterned to form the first opening 169 over the bottom contact structure 166 and the second opening 171 adjacent to the first opening 169, in accordance with some embodiments. The width of the first opening 169 is greater than the width of the second opening 171. Furthermore, a portion of the bottom contact structure 166 is removed, and the top surface of the bottom contact structure 166 is lower than the top surface of the ILD layer 140.

Figures 4C, 4D:
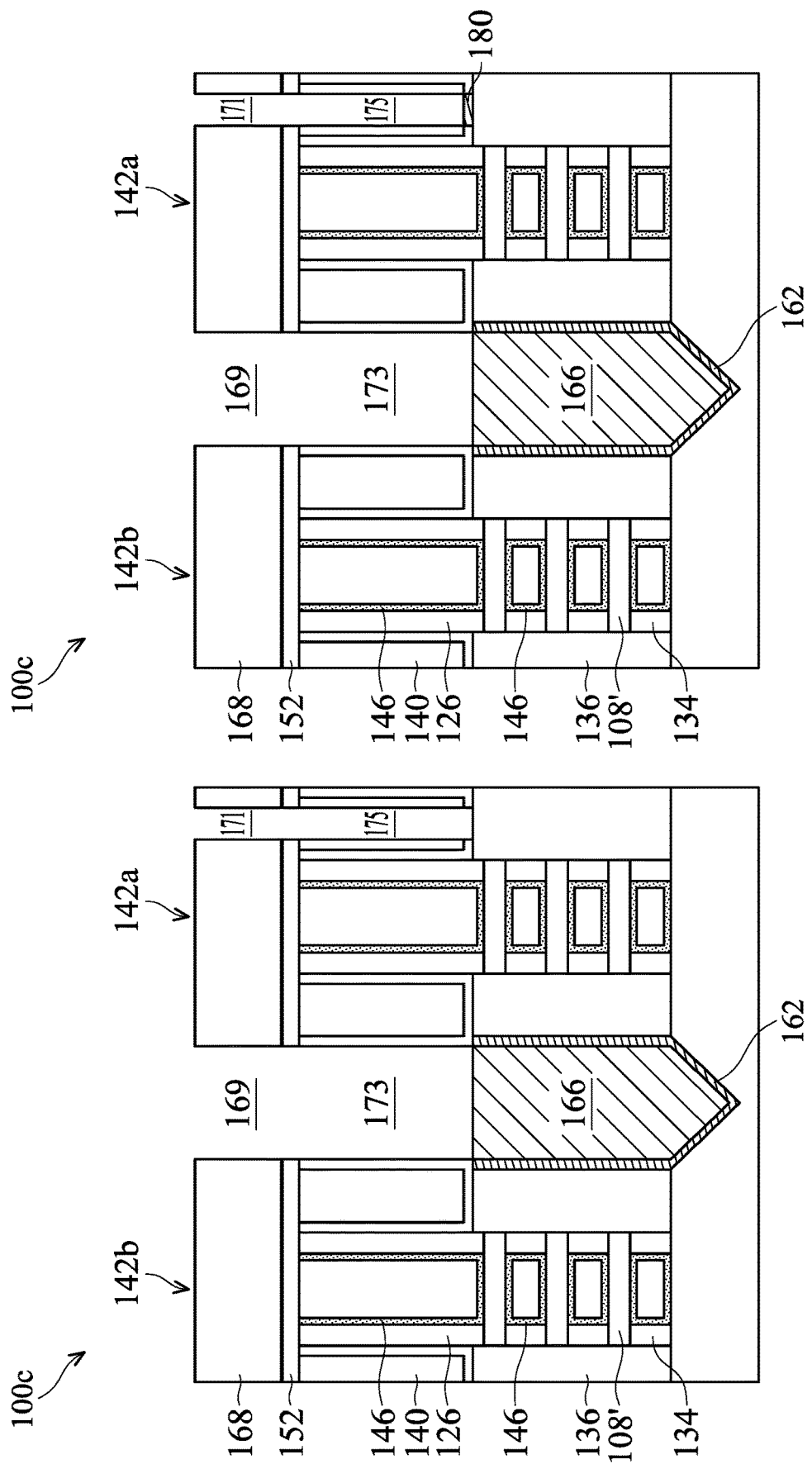

Next, as shown in FIG. 4C, the top portion of the ILD layer 140 and a portion of the CESL 138 are removed to form the first trench 173 and the second trench 175, in accordance with some embodiments. The first opening 169 is connected to the first trench 173, and the second opening 171 is connected to the second trench 175. As a result, the top surface of the S/D structure 136 is exposed. The width of the first trench 173 is greater than the width of the second trench 175.

Afterwards, as shown in FIG. 4D, the top silicide layer 180 is formed in the second trench 175 and on the exposed S/D structure 162, in accordance with some embodiments.

Figures 4E, 5:
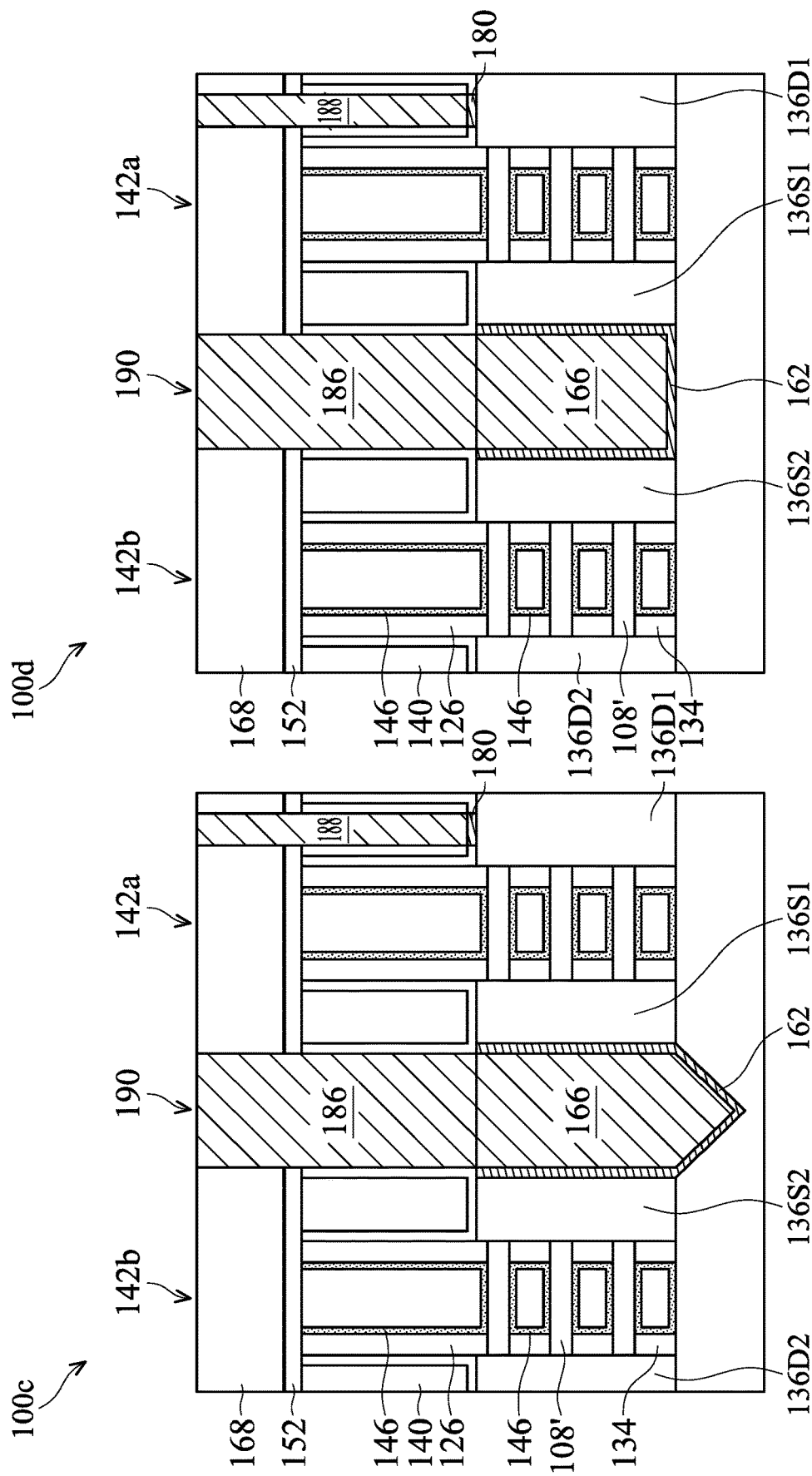

Next, as shown in FIG. 4E, the top contact structure 186 is formed over the bottom contact structure 166, and another S/D contact structure 188 is formed on the top silicide layer 180, in accordance with some embodiments. The S/D contact structure 190 is constructed by the top contact structure 186 and the bottom contact structure 166. The height of the S/D contact structure 190 is greater than the height of the S/D contact structure 188. The S/D contact structure 190 in FIG. 2T-1 has a T-shaped structure, and the S/D contact structure 190 in FIG. 4E has a rectangular-shaped structure. Since the distance between the S/D contact structure 190 and the first gate structure 142a in FIG. 4E is greater than the S/D contact structure 190 and the first gate structure 142a in FIG. 2T, the unwanted parasitic capacitance is reduced, and the semiconductor device structure 100c of FIG. 4A has a lower parasitic capacitance than the parasitic capacitor of semiconductor device structure 100a of FIG. 2T.

FIG. 5 shows a cross-sectional view of a semiconductor device structure 100d, in accordance with some embodiments. The semiconductor device structure 100d of FIG. 5 includes elements that are similar to, or the same as, elements of the semiconductor device structure 100c of FIG. 4E, the difference between FIG. 5 and FIG. 2T is that, bottom surface of the bottom silicide layer 162 has a substantially planar bottom surface and the bottom contact structure 166 does not extend into the substrate 102 in FIG. 5.

FIG. 6 shows a top-view of a semiconductor device structure 100e, in accordance with some embodiments.

As shown in FIG. 6, the first drain structure 136D1 and the first source structure 136S1 are on opposite sides of the first gate structure 142a. The second drain structure 136D2 and the second source structure 136S2 are on opposite sides of the second gate structure 142b. An S/D contact structure 220 is between the first source structure 136S1 and the second source structure 136S2. The S/D contact structure 220 is also between the first gate structure 142a and the second gate structure 142b.

Figure 7A:
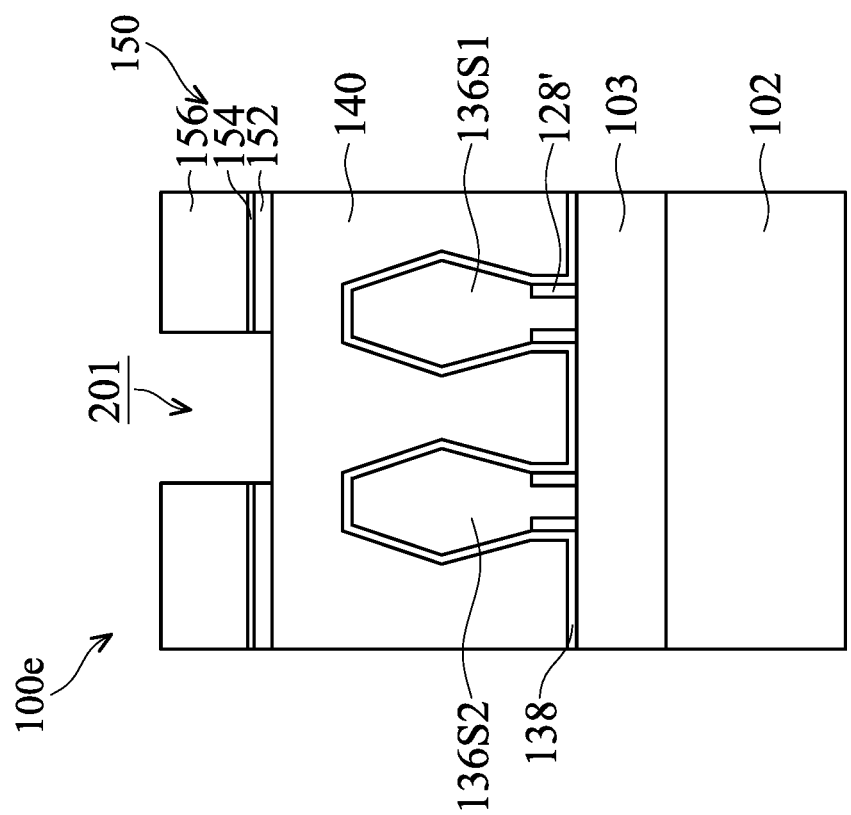
FIGS. 7A-7N shows cross-sectional views of another intermediate stage of manufacturing the semiconductor device structure shown along line C-C' in FIG. 6, in accordance with some embodiments.

FIGS. 7A-7N show cross-sectional views of another intermediate stage of manufacturing the semiconductor device structure 100e shown along line C-C' in FIG. 6, in accordance with some embodiments. The S/D contact structure 220 of the semiconductor device structure 100e is formed by using the space (through the ILD layer 140) between two adjacent first source structures 136S1 and the second source structure 136S2, but not formed by removing a dummy gate structure (e.g. the third gate structure 142c shown in FIG. 2A-2J). The semiconductor device structure 100e provides a conductive path from the front side to the back side by forming the S/D contact structure 220 through the ILD layer 140 between the first source structure 136S1 and the second source structure 136S2.

The semiconductor device structure 100e of FIGS. 7A-7N includes elements that are similar to, or the same as, elements of the semiconductor device structure 100a of FIG. 2T, the difference is that, a dielectric layer 103 is formed on the substrate 102. In addition, the semiconductor device structure 100e in FIG. 7A is similar to, or the same as semiconductor device structure 100a in FIG. 2G-2, the difference is that two adjacent S/D structures 136S1, 136S2 are shown in FIG. 7A.

As shown in FIG. 7A, a dielectric layer 103 is formed over the substrate 102. In some embodiments, the dielectric layer 103 is made of oxide layer. In some embodiments, a SOI (Silicon on Insulator) substrate is provided. The fin spacers 128' is formed over the dielectric layer 103, and the first source structure 136S1 and the second source structure 136S2 are formed over the dielectric layer 103. The CESL 138 is formed over the first source structure 136S1 and the second source structure 136S2, and the ILD layer 140 is formed over the CESL 138. The mask structure 150 including the first mask layer 152, the second mask layer 154 and the third mask layer 156 is formed over the ILD layer 140.

Figure 7B:
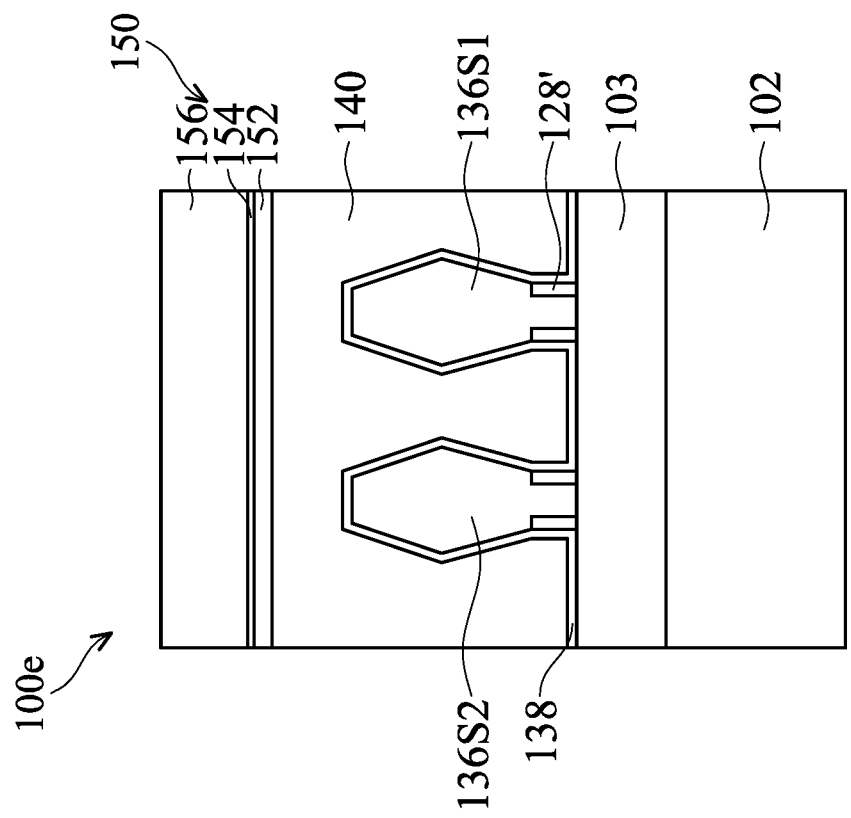

Next, as shown in FIG. 7B, the mask structure 150 is patterned to form an opening 201, in accordance with some embodiments. As a result, the top surface of the ILD layer 140 is exposed.

Figure 7C:
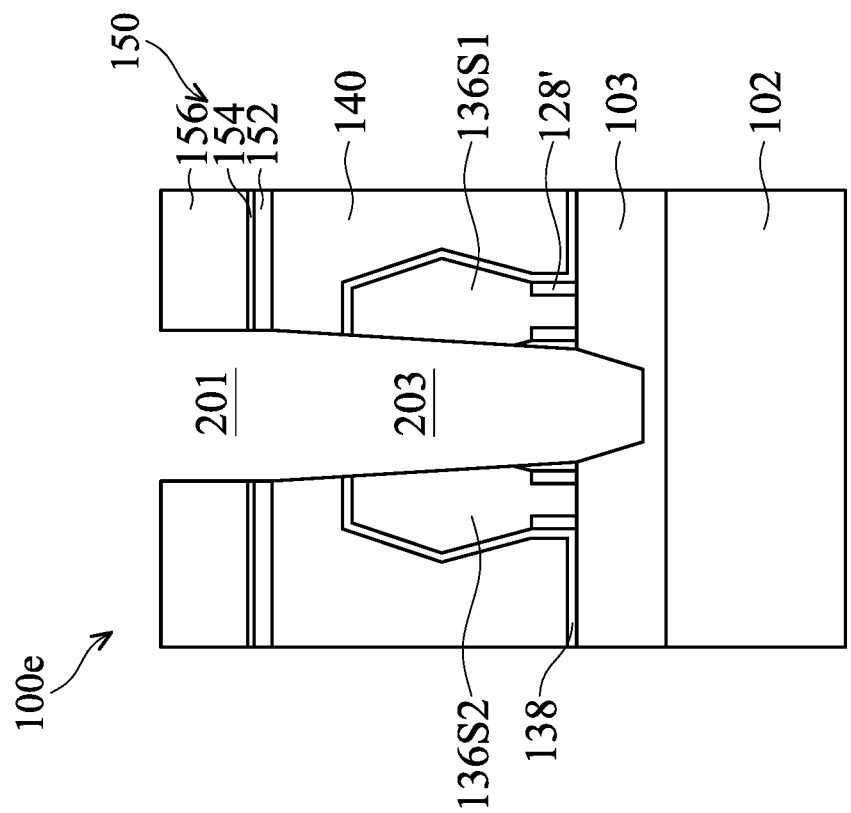

Afterwards, as shown in FIG. 7C, a portion of the ILD layer 140 and a portion of first source structure 136S1 and the second source structure 136S2 are removed to form a trench 203, in accordance with some embodiments. As a result, the top surface of the dielectric layer 103 is exposed. The sidewall surfaces of the first source structure 136S1 and the second source structure 136S2 are exposed.

Figure 7D:
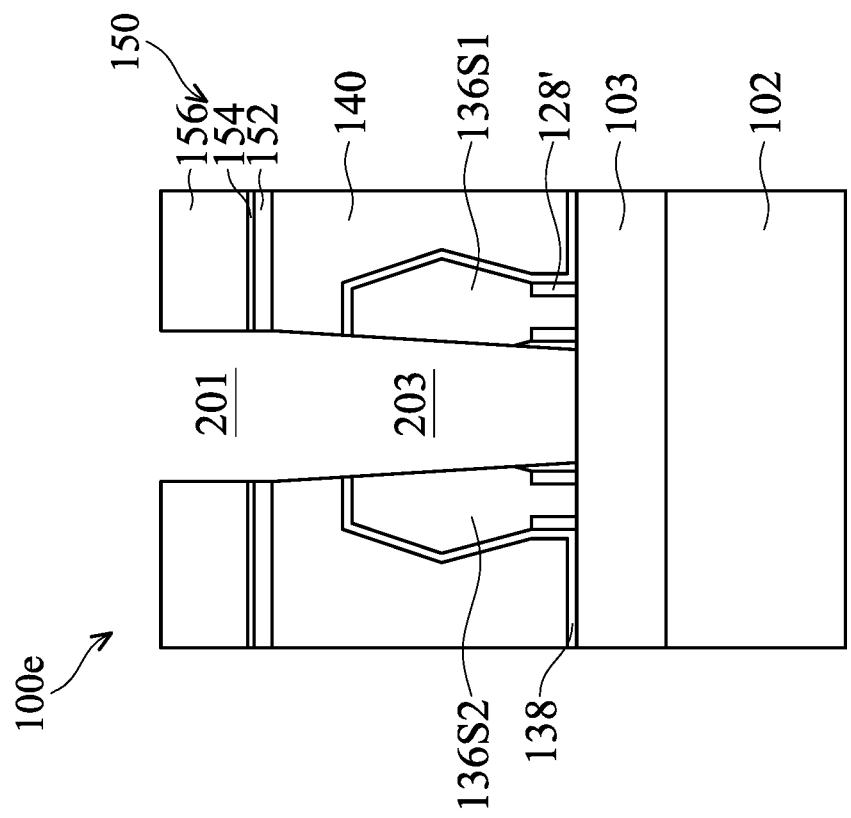

Afterwards, as shown in FIG. 7D, a portion of the dielectric layer 103 is removed, in accordance with some embodiments. The trench 203 extends into the dielectric layer 103. The bottom surface of the trench 203 is lower than top surface of the dielectric layer 103.

Figure 7F:
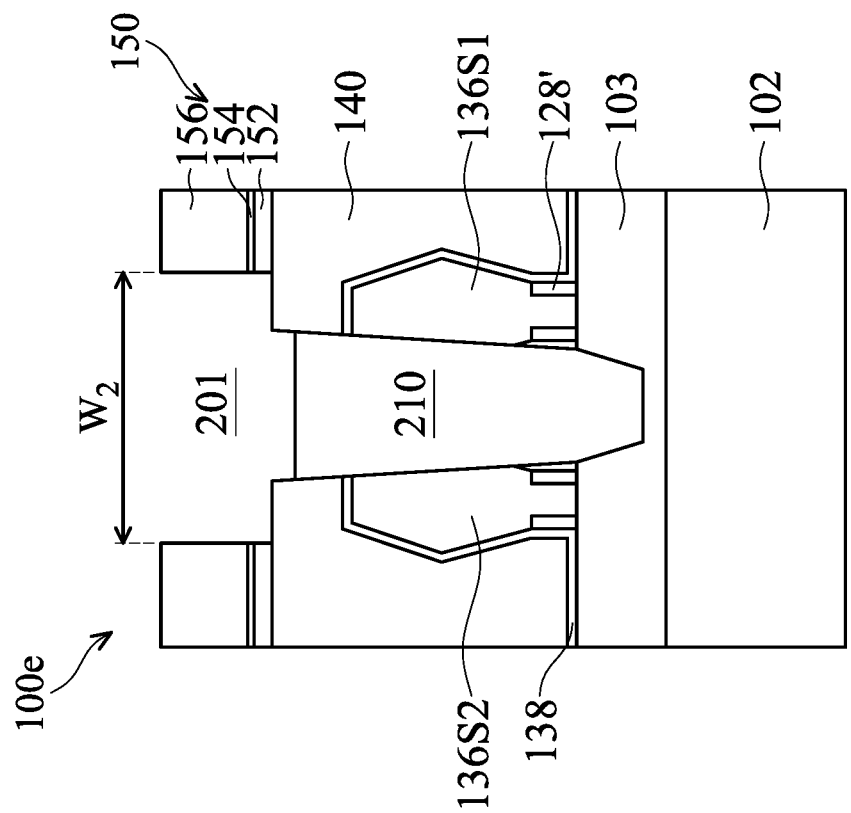
Figure 7E:
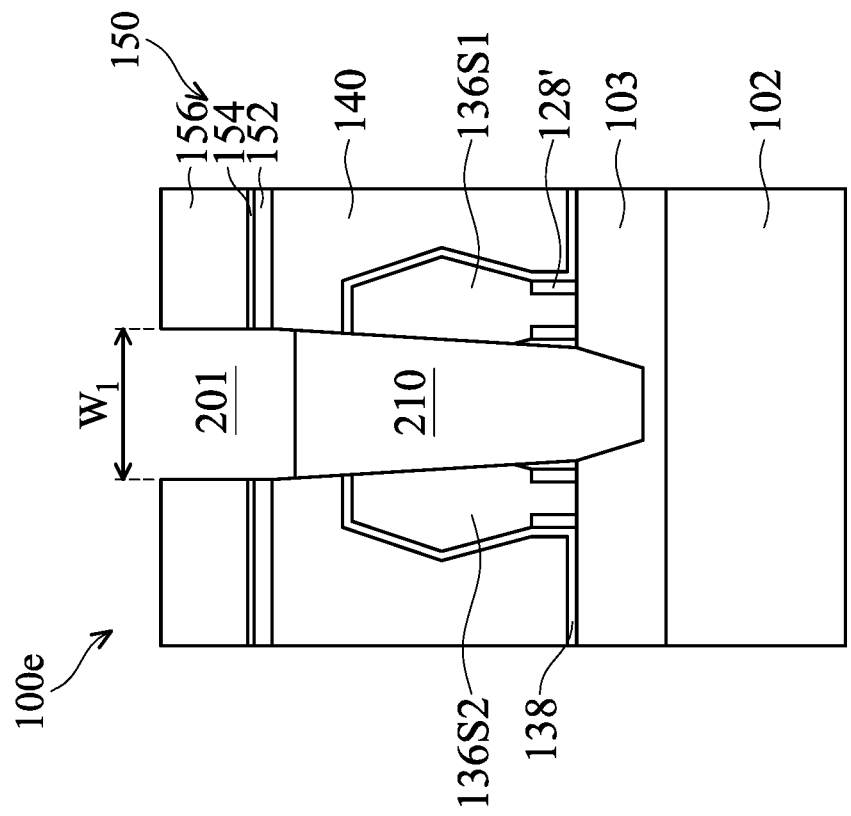

Afterwards, as shown in FIG. 7E, a mask layer 210 is formed in the trench 203, in accordance with some embodiments. The material of the mask layer 210 is formed over in the trench 203 and in the opening 201, and then an etching back process is performed to remove top portion of the mask layer 210. As a result, the opening 201 is not filled with the mask layer 210.

In some embodiments, the mask layer 210 is made of $SiO_2$, $Si_3N_4$, SiON, SiOCN, SiOCH, or the like. The mask layer 210 may be formed using chemical vapor deposition (CVD), atomic layer deposition (ALD), electroplating, another applicable method, or a combination thereof. In some embodiments, the opening 201 has a first width $W_1$.

Afterwards, as shown in FIG. 7F, the opening 201 is enlarged, in accordance with some embodiments. In some embodiments, the opening 201 has a second width $W_2$, and the second width $W_2$ is greater than the first width $W_1$. In some embodiments, the opening 201 is enlarged by an etching process, such as a dry etching process or a wet etching process.

Figure 7G:
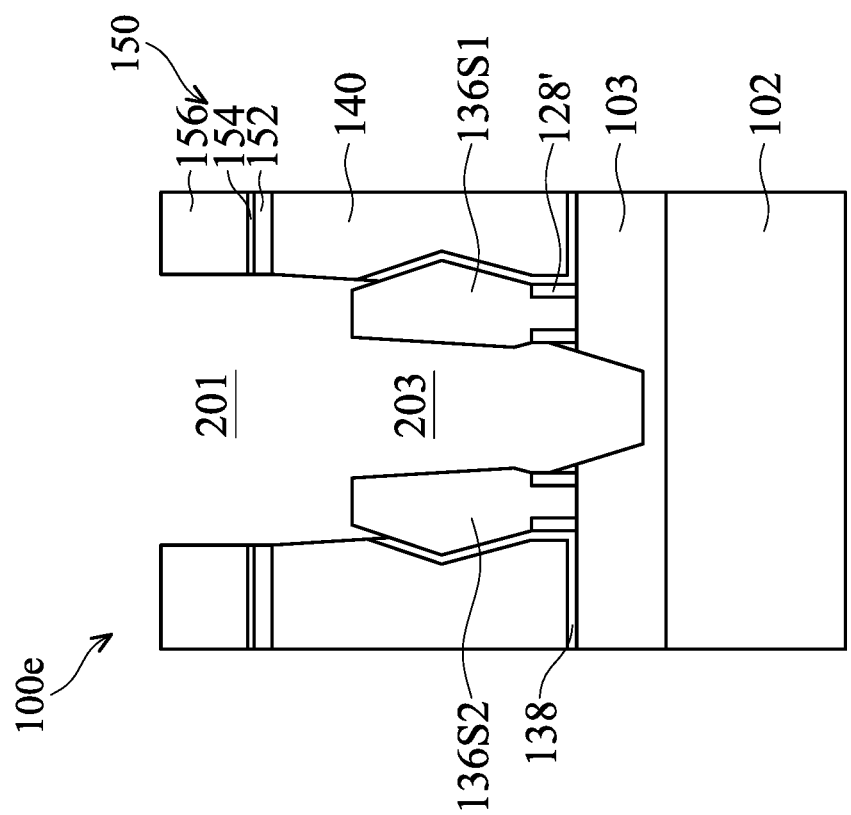

Afterwards, as shown in FIG. 7G, a portion of the ILD layer 140 is removed to expose the top surfaces of the first source structure 136S1 and the second source structure 136S2, in accordance with some embodiments.

Figure 7H:
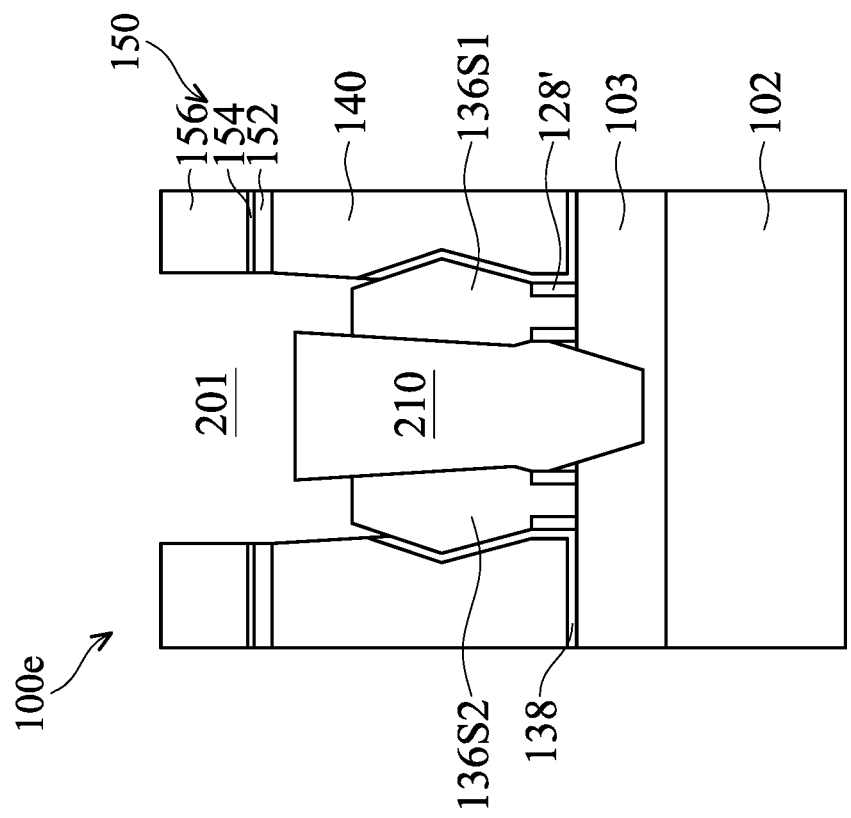

Afterwards, as shown in FIG. 7H, the mask layer 210 is removed and the trench 203 is exposed, in accordance with some embodiments. In some embodiments, the mask layer 210 is removed by an etching process, such as a dry etching process or a wet etching process.

Figure 7J:
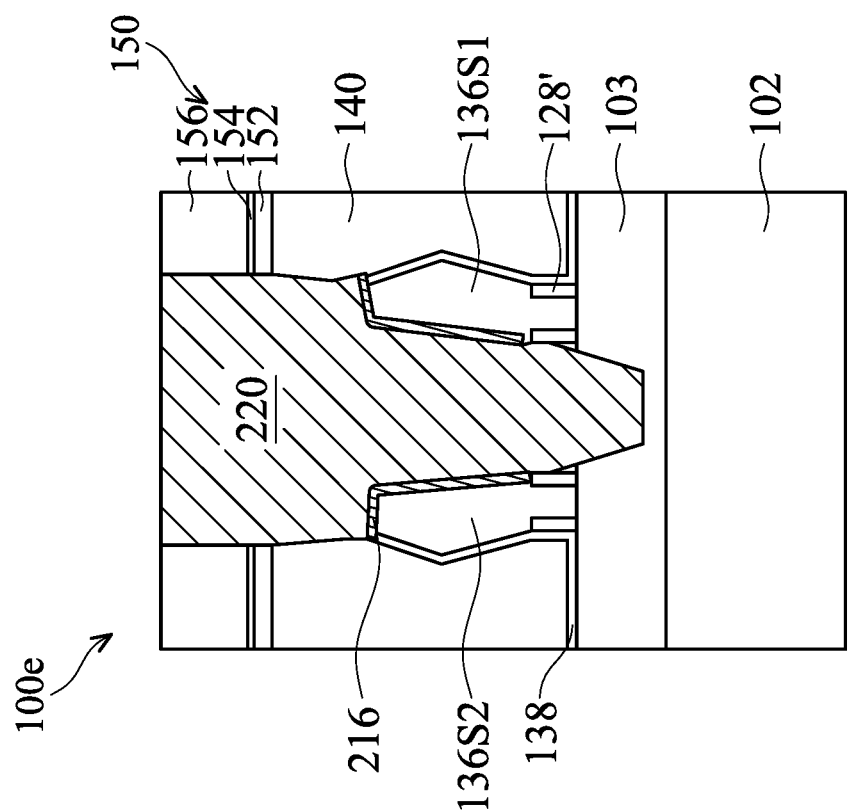
Figure 7I:
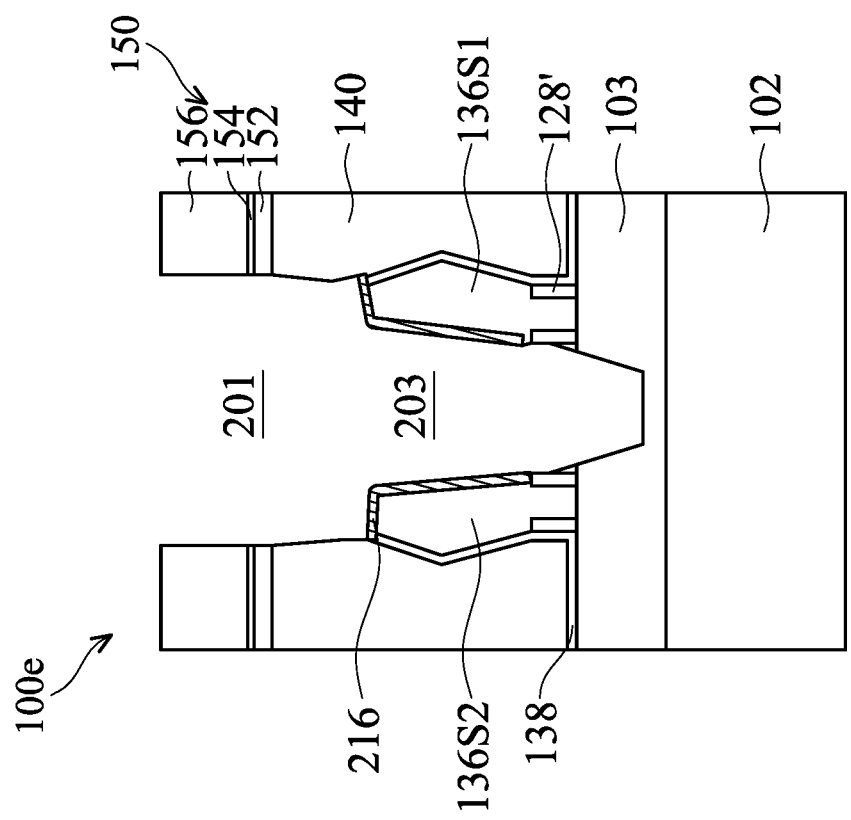

Afterwards, as shown in FIG. 7I, a silicide layer 216 is formed over the exposed top surfaces of the first source structure 136S1 and the second source structure 136S2, in accordance with some embodiments. In some embodiments, the silicide layer 216 is in direct contact with the fin spacers 128'.

The silicide layer 216 may be formed by forming a metal layer over the top surface of the S/D structures 136 and annealing the metal layer so the metal layer reacts with the S/D structure 136 to form the silicide layers 216. The unreacted metal layer may be removed after the silicide layer 216 are formed. In some embodiments, the silicide layer 216 is made of nickel silicide (NiS), cobalt silicide (CoSi), copper silicide, tantalum carbide (TaC), tantalum silicide nitride (TaSiN), or another applicable material.

Afterwards, as shown in FIG. 7J, the S/D contact structure 220 is formed on the silicide layer 216 and in the opening 210 and in the trench 203, in accordance with some embodiments.

Figures 7K, 7L:
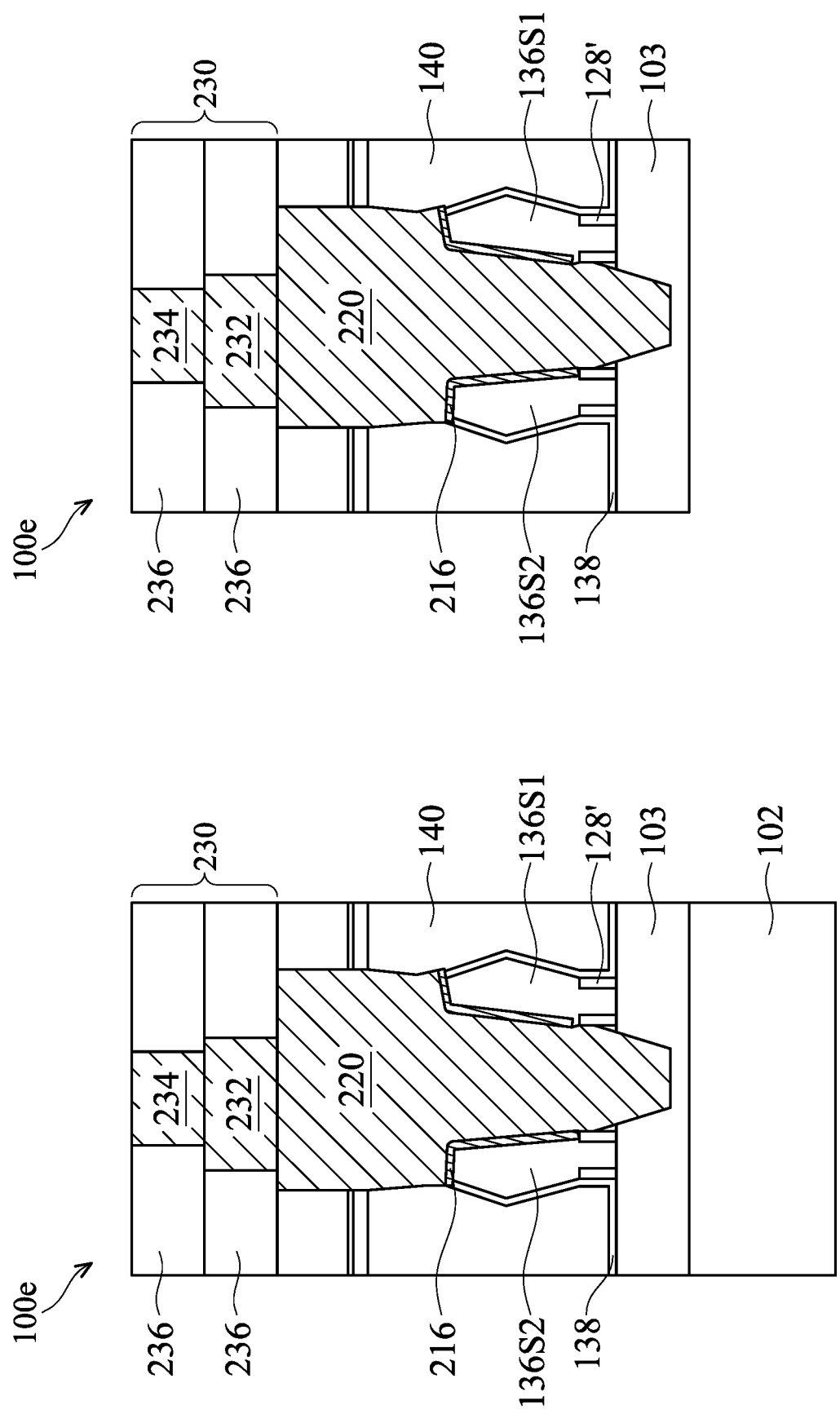

Afterwards, as shown in FIG. 7K, an interconnect structure 230 is formed over the S/D contact structure 220, in accordance with some embodiments. The interconnect structure 230 includes a conductive layer 232 and a conductive via 234 in the dielectric layer 236.

The conductive layer 232 and the conductive via 234 are made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another application material. In some embodiments, the conductive layer 232 and the conductive via 234 are formed by a deposition process, such as a chemical vapor deposition (CVD) process, physical vapor deposition (PVD) process, atomic layer deposition (ALD) process, plating process or another application process.

The dielectric layer 236 include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The dielectric layer 236 may be formed by chemical vapor deposition (CVD), physical vapor deposition, (PVD), atomic layer deposition (ALD), or other applicable processes.

Afterwards, as shown in FIG. 7L, the substrate 102 is removed, and the interconnected structure is bonded to a carrier substrate (not shown), in accordance with some embodiments.

Afterwards, as shown in FIG. 7M, a portion of the dielectric layer 103 is removed to expose the bottom surface of the S/D contact structure 220, in accordance with some embodiments. In some embodiments, the portion of the dielectric layer 103 is removed by an etching process, such as a dry etching process or a wet etching process.

Afterwards, as shown in FIG. 7N, a backside conductive layer 240 is formed on the bottom surface of the S/D contact structure 220, in accordance with some embodiments. The backside conductive layer 240 is formed in a dielectric layer 242, and a backside conductive via 246 is connected to the backside conductive layer 240 and formed in the dielectric layer 242. The S/D contact structure 220 is through the dielectric layer 103 and in direct contact with the backside conductive layer 240.

The backside conductive layer 240 and the backside conductive via 246 are made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another application material. In some embodiments, the backside conductive layer 240 and the backside conductive via 246 are formed by a deposition process, such as a chemical vapor deposition (CVD) process, physical vapor deposition (PVD) process, atomic layer deposition (ALD) process, plating process or another application process.

The dielectric layer 242 include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The dielectric layer 242 may be formed by chemical vapor deposition (CVD), physical vapor deposition, (PVD), atomic layer deposition (ALD), or other applicable processes.

The interconnect structure 230 is electrically connected to the backside conductive layer 240 by the S/D contact structure 220. Since the conductive path from front side to backside is through the conductive material (e.g. the S/D contact structure 220) (not through semiconductor material), the contact resistance is greatly reduced. In addition, since the silicide layer 216 not only formed on top surface of the first source structure 136S1 and the second source structure 136S2, but also formed on sidewall surfaces of first source structure 136S1 and the second source structure 136S2, the contact resistance between the first source structure 136S1 and the second source structure 136S2, and the S/D contact structure 220 is reduced due to the large contact area of the silicide layer 216.

The backside conductive layer 240 is configured to connect to a power line. If the power line is connected to a conductive layer at front side, the conductive layer is narrow and thin and the IR drop is too high. In this disclosure, in order to resolve the IR drop issue, the power line is directly connected to the backside conductive layer 240. The backside conductive layer 240 can be designed to be thick and wide for actual application. Therefore, the drive current becomes higher and the device speed is faster. Accordingly, the performance of the semiconductor device structure 100e is improved.

It should be noted that same elements in FIGS. 1A to 7N may be designated by the same numerals and may include similar or the same materials and may be formed by similar or the same processes; therefore such redundant details are omitted in the interest of brevity. In addition, although FIGS. 1A to 7N are described in relation to the method, it will be appreciated that the structures disclosed in FIGS. 1A to 7N are not limited to the method but may stand alone as structures independent of the method. Similarly, although the methods shown in FIGS. 1A to 7N are not limited to the disclosed structures but may stand alone independent of the structures. Furthermore, the nanostructures described above may include nanowires, nanosheets, or other applicable nanostructures in accordance with some embodiments.

Also, while disclosed methods are illustrated and described below as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure includes forming a gate structure, a source/drain (S/D) structure adjacent to the gate structure. A silicide layer is formed on sidewall surfaces and on top surface of the S/D structure, and the S/D contact structure is formed on the silicide layer. Since the silicide layer provide large contact area, the contact resistance between the S/D structure and the S/D contact structure is reduced. In addition, the S/D contact structure is formed through the ILD layer between two adjacent S/D structures, and the S/D contact structure is directly connected to a backside conductive layer for power line. The S/D contact structure provides a conductive path from front side to back side, and the conductive resistance is also reduced. Therefore, the drive current becomes higher and the device speed is faster. Accordingly, the performance of the semiconductor device structure is improved.

In some embodiments, a semiconductor device structure is provided. The semiconductor structure includes a plurality of first nanostructures formed over a substrate, and a gate structure formed over the first nanostructures. The semiconductor structure includes a source/drain (S/D) structure formed adjacent to the gate structure, and a silicide layer formed on a sidewall surface of the S/D structure. The semiconductor structure also includes an S/D contact structure formed over the silicide layer, and the S/D contact structure extends from a first position to a second position, the first position is higher than a top surface of the gate structure, and the second position is below a bottommost nanostructure.

In some embodiments, a semiconductor device structure is provided. The semiconductor structure includes a plurality of first nanostructures formed over a substrate, and a first gate structure formed over the first nanostructures. The semiconductor structure includes a first drain structure and a first source structure formed adjacent to the gate structure. The semiconductor structure further includes a drain silicide layer formed on a top surface of the first drain structure, and a source silicide layer formed on a sidewall surface of the first source structure. The bottom surface of the source silicide layer is lower than a bottom surface of the drain silicide layer. The semiconductor structure includes a drain contact structure formed on the drain silicide layer, and a source contact structure formed on the source silicide layer.

In some embodiments, a method for manufacturing a semiconductor structure is provided. The method includes forming nanostructures over a substrate, and forming a first gate structure wrapped around the nanostructures. The method also includes forming a first source/drain (S/D) structure and a second S/D structure adjacent to the first gate structure. The method includes forming a trench between the first S/D structure and the second S/D structure, and a sidewall of the first S/D structure and a sidewall of the second S/D structure are exposed by the trench. The method includes forming a silicide layer on the sidewall of the first S/D structure and the sidewall of the second S/D structure.

The method includes forming an S/D contact structure in the trench and on the silicide layer, and a bottom surface of the S/D contact structure is lower than a bottom nanostructure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a plurality of first nanostructures formed over a substrate;
    a gate structure formed over the first nanostructures;
    a first source/drain (S/D) structure formed adjacent to the gate structure;
    a silicide layer formed on a sidewall surface of the first S/D structure;
    an S/D contact structure formed over the silicide layer, wherein the S/D contact structure extends from a first position to a second position, the first position is higher than a top surface of the gate structure, and the second position is below a bottommost nanostructure;
    an etch stop layer formed over the first S/D structure; and
    a dielectric layer formed over the etch stop layer, wherein the silicide layer is directly below the etch stop layer.

2. The semiconductor device structure as claimed in claim 1, wherein the silicide layer extends to a top surface of the first S/D structure.

3. The semiconductor device structure as claimed in claim 2, wherein the S/D contact structure has a T-shaped structure.

4. The semiconductor device structure as claimed in claim 1, wherein the S/D contact structure extends into the substrate.

5. The semiconductor device structure as claimed in claim 1, further comprising:
    a dielectric layer formed below the first S/D structure; and
    a backside conductive layer formed below the dielectric layer, wherein the S/D contact structure is through the dielectric layer and in direct contact with the conductive layer.

6. The semiconductor device structure as claimed in claim 1, further comprising:
    a plurality of second nanostructures formed adjacent to the first nanostructures; and
    a second S/D structure formed adjacent to the second nanostructures, wherein the S/D contact structure is between the first S/D structure and the second S/D structure.

7. The semiconductor device structure as claimed in claim 1, wherein a bottom surface of the silicide layer is lower than a bottom surface of the first S/D structure.

8. The semiconductor device structure as claimed in claim 1, wherein a bottom surface of the S/D contact structure is lower than a bottom surface of the first S/D structure.

9. The semiconductor device structure as claimed in claim 1, wherein S/D contact structure comprises a sidewall surface, and the sidewall surface has a first vertical portion, a second vertical portion and a horizontal portion between the first vertical portion and the second vertical portion.

10. A semiconductor device structure, comprising:
    a plurality of first nanostructures formed over a substrate;
    a first gate structure formed over the first nanostructures;
    a first drain structure and a first source structure formed adjacent to the first gate structure;
    a drain silicide layer formed on a top surface of the first drain structure;
    a source silicide layer formed on a sidewall surface of the first source structure, wherein a bottom surface of the source silicide layer is lower than a bottom surface of the drain silicide layer;
    a drain contact structure formed on the drain silicide layer; and
    a source contact structure formed on the source silicide layer.

11. The semiconductor device structure as claimed in claim 10, wherein a bottom surface of the drain contact structure is higher than a bottom surface of the source contact structure.

12. The semiconductor device structure as claimed in claim 10, wherein the source contact structure extends into the substrate.

13. The semiconductor device structure as claimed in claim 10, further comprising:
    a plurality of second nanostructures formed adjacent to the first nanostructures; and
    a second source structure formed adjacent to the second nanostructures, wherein the source contact structure is between the first source structure and the second source structure.

14. The semiconductor device structure as claimed in claim 10, further comprising:
    a dielectric layer formed below the first source structure; and
    a backside conductive layer formed below the dielectric layer, wherein the source contact structure is through the dielectric layer and in direct contact with the backside conductive layer.

15. The semiconductor device structure as claimed in claim 10, wherein a bottom surface of the source contact structure is lower than a bottom nanostructure.

16. A semiconductor device structure, comprising:
    a plurality of first nanostructures formed over a substrate;
    a first gate structure formed over the first nanostructures;
    a first drain structure and a first source structure formed adjacent to the first gate structure;
    a plurality of second nanostructures formed adjacent to the first nanostructures;
    a second source structure formed adjacent to the second nanostructures;
    a source contact structure between the first source structure and the second source structure, wherein the first source structure and the second source structure are formed on opposite sidewalls of the source contact structure; and
    a drain contact structure formed on the first drain structure, wherein a bottom surface of the drain contact structure is higher than a top surface of a topmost first nanostructure.

17. The semiconductor device structure as claimed in claim 16, wherein a bottommost surface of the source contact structure is lower than a bottom surface of a bottommost first nanostructures.

18. The semiconductor device structure as claimed in claim 16, wherein a bottommost surface of the source contact structure is lower than a bottom surface of the first drain structure.

19. The semiconductor device structure as claimed in claim 16, further comprising:
- a source silicide layer formed on a top surface of the first source structure and a top surface of the second source structure.

20. The semiconductor device structure as claimed in claim 16, further comprising:
- a dielectric layer formed below the first source structure; and
- a backside conductive layer formed below the dielectric layer, wherein the source contact structure is through the dielectric layer and in direct contact with the backside conductive layer.

* * * * *